(12) United States Patent
Whittaker et al.

(10) Patent No.: US 7,602,272 B2
(45) Date of Patent: Oct. 13, 2009

(54) MINIATURE CIRCUITRY AND INDUCTIVE COMPONENTS AND METHODS FOR MANUFACTURING SAME

(75) Inventors: Ronald W. Whittaker, Escondido, CA (US); Joe D Guerra, Lake Forest, CA (US); Ciprian Marcoci, Anaheim, CA (US)

(73) Assignee: Multi-Fineline Electronix, Inc., Anaheim, CA (US)

( * ) Notice: Subject to any disclaimer, the term of this patent is extended or adjusted under 35 U.S.C. 154(b) by 158 days.

(21) Appl. No.: 11/895,447

(22) Filed: Aug. 24, 2007

(65) Prior Publication Data

US 2008/0017404 A1 Jan. 24, 2008

Related U.S. Application Data

(62) Division of application No. 11/296,579, filed on Dec. 7, 2005, now Pat. No. 7,271,697.

(60) Provisional application No. 60/633,742, filed on Dec. 7, 2004.

(51) Int. Cl.
  *H01F 5/00* (2006.01)
(52) U.S. Cl. .................................... 336/200
(58) Field of Classification Search ............ 336/65, 336/200, 225, 229, 232; 361/760–764
  See application file for complete search history.

(56) References Cited

U.S. PATENT DOCUMENTS

| | | |
|---|---|---|
| 3,372,358 A | 3/1968 | Roy et al. |
| 3,583,066 A | 6/1971 | Carbonel |
| 3,673,680 A | 7/1972 | Tanaka et al. |
| 3,684,991 A | 8/1972 | Trump et al. |
| 3,898,595 A | 8/1975 | Launt |
| 4,253,231 A | 3/1981 | Nouet |
| 4,383,235 A | 5/1983 | Layton et al. |
| 4,525,246 A | 6/1985 | Needham |
| 4,547,705 A | 10/1985 | Hirayama et al. |
| 4,622,627 A | 11/1986 | Rodriguez et al. |
| 4,665,357 A | 5/1987 | Herbert |
| 4,901,048 A | 2/1990 | Williamson |
| 5,055,816 A * | 10/1991 | Altman et al. ............ 336/200 |
| 5,070,317 A | 12/1991 | Bhagat |

(Continued)

FOREIGN PATENT DOCUMENTS

DE 4301570 A1 7/1993

(Continued)

*Primary Examiner*—Tuyen T. Nguyen
(74) *Attorney, Agent, or Firm*—Knobbe, Martens, Olson & Bear, LLP

(57) ABSTRACT

Miniature circuitry and inductor components in which multiple levels of printed circuitry are formed on each side of a support panel, typically a printed circuit board or rigid flex. Electrical connection between the plural levels of circuitry and multiple windings around magnetic members are provided by plural plated through hole conductors. Small through hole openings accommodate a plurality of the plated through hole conductors since each is insulated from the others by a very thin layer of vacuum deposited organic layer such as parylene having a high dielectric strength. Adhesion of this plated copper to the organic layer is provided by first applying an adhesive promotor to the surface of the organic layer followed by the vacuum deposition of the organic layer.

8 Claims, 41 Drawing Sheets

U.S. PATENT DOCUMENTS

| | | |
|---|---|---|
| 5,126,714 A | 6/1992 | Johnson |
| 5,160,579 A | 11/1992 | Larson |
| 5,257,000 A | 10/1993 | Billings et al. |
| 5,300,911 A | 4/1994 | Walters |
| 5,392,020 A | 2/1995 | Chang |
| 5,487,214 A | 1/1996 | Walters |
| 5,502,893 A | 4/1996 | Endoh et al. |
| 5,514,337 A | 5/1996 | Groger et al. |
| 5,532,667 A | 7/1996 | Gonzalez et al. |
| 5,576,052 A | 11/1996 | Arledge et al. |
| 5,626,736 A | 5/1997 | Florio et al. |
| 5,781,091 A | 7/1998 | Krone et al. |
| 5,802,702 A | 9/1998 | Fleming et al. |
| 5,877,669 A | 3/1999 | Choi |
| 5,898,991 A | 5/1999 | Fogel et al. |
| 5,942,965 A | 8/1999 | Kitamura et al. |
| 5,959,846 A | 9/1999 | Noguchi et al. |
| 5,996,214 A | 12/1999 | Bell |
| 6,040,753 A | 3/2000 | Bicknell et al. |
| 6,148,500 A | 11/2000 | Krone et al. |
| 6,211,767 B1 | 4/2001 | Jitaru |
| 6,222,733 B1 | 4/2001 | Gammenthaler |
| 6,262,463 B1 | 7/2001 | Miu et al. |
| 6,270,375 B1 | 8/2001 | Cox et al. |
| 6,278,354 B1 | 8/2001 | Booth |
| 6,329,606 B1 | 12/2001 | Freyman et al. |
| 6,383,033 B1 | 5/2002 | Politsky et al. |
| 6,537,608 B2 | 3/2003 | Miller et al. |
| 6,593,836 B1 | 7/2003 | Lafleur et al. |
| 6,820,321 B2 | 11/2004 | Harding |
| 6,990,729 B2 | 1/2006 | Pleskach et al. |
| 7,196,607 B2 | 3/2007 | Pleskach et al. |
| 7,253,711 B2 * | 8/2007 | Pleskach et al. ............. 336/200 |
| 7,271,697 B2 | 9/2007 | Whittaker et al. |
| 7,304,558 B1 * | 12/2007 | Pleskach et al. ............. 336/200 |
| 7,375,611 B1 * | 5/2008 | Pleskach et al. ............. 336/229 |
| 2004/0135662 A1 | 7/2004 | Harding |
| 2005/0034297 A1 | 2/2005 | Harding |
| 2005/0093672 A1 | 5/2005 | Harding |

FOREIGN PATENT DOCUMENTS

| | | |
|---|---|---|
| DE | 19639881 A1 | 4/1998 |
| EP | 0033441 A1 | 8/1981 |
| EP | 0262329 A1 | 4/1988 |
| EP | 0512718 A1 | 11/1992 |
| EP | 0756298 A2 | 1/1997 |
| EP | 0880150 A2 | 11/1998 |
| EP | 0936639 A2 | 8/1999 |
| JP | 03 276604 | 12/1991 |
| JP | 07 022241 | 1/1995 |
| JP | 09 083104 | 3/1997 |
| JP | 09 186041 | 7/1997 |
| JP | 363228604 A | 7/1997 |
| JP | 10 116746 A2 | 5/1998 |
| JP | 11 040915 | 2/1999 |
| JP | 11 243016 | 9/1999 |
| JP | 11 312619 | 11/1999 |
| JP | 2000 182851 A | 6/2000 |
| TW | 432412 | 5/2001 |
| WO | WO 98/43258 | 10/1998 |
| WO | WO 02/32198 A2 | 4/2002 |
| WO | WO 02/32198 A3 | 4/2002 |
| WO | WO 2004/025671 A3 | 3/2004 |

* cited by examiner

MINIATURE CIRCUITRY AND INDUCTIVE COMPONENTS AND METHODS FOR MANUFACTURING SAME This application is a divisional of U.S. application Ser. No. 11/296,579, filed Dec. 7, 2005, now U.S. Pat. No. 7,271,697, which claims the benefit of U.S. Provisional Application No. 60/633,742 filed Dec. 7, 2004 the entire contents of which is expressly incorporated herein by reference.

FIELD OF THE INVENTION

The present invention relates to improvements in miniature electrical circuits and inductors and transformers and methods of manufacturing these devices.

SUMMARY OF THE INVENTION

One aspect of the invention is a high yield process for manufacturing improved miniature circuits, inductors and transformers having high functional reliability. In particular, the process fabricates two or more independent and isolated conductors in the same via holes. Aspects of this embodiment include closely spacing while maintaining a high voltage barrier between the conductors and providing interconnect reliability.

For inductive embodiments, the two or more independent conductors are advantageously fabricated on the wall of a hole either in or proximate to a ferrite member embedded in a cavity in a printed circuit board or flexible circuit. Embodiments include holes located in a ferrite plate and holes located around a ferrite toroid. These conductors function as windings of an inductor or transformer.

In another embodiment, the two or more independent conductors are formed on the wall of vias in circuit board or flexible circuits to interconnect circuits and circuit elements located on opposite sides of the printed circuit board or flexible circuit.

Extremely miniature devices are constructed by providing an extremely thin but very high dielectric film between plural plated through hole conductors in each via. In addition, further miniaturization is provided by utilizing printed circuits over the entire surface of the support panel and locating surface mounted components over the magnetic members embedded within the support panel.

The miniaturization achieved by the circuits and processes enable, for example, very small and lightweight power supplies for laptop computers, digital cameras, portable audio and T.V. devices, and cell phones.

The improved inductor and circuit configurations enable efficient and repeatable manufacture of miniature circuits and miniature inductors and transformers having high voltage, high current capabilities, as well as high tolerance to physical stress.

DETAILED DESCRIPTION OF THE PREFERRED EMBODIMENTS

Figure 1:
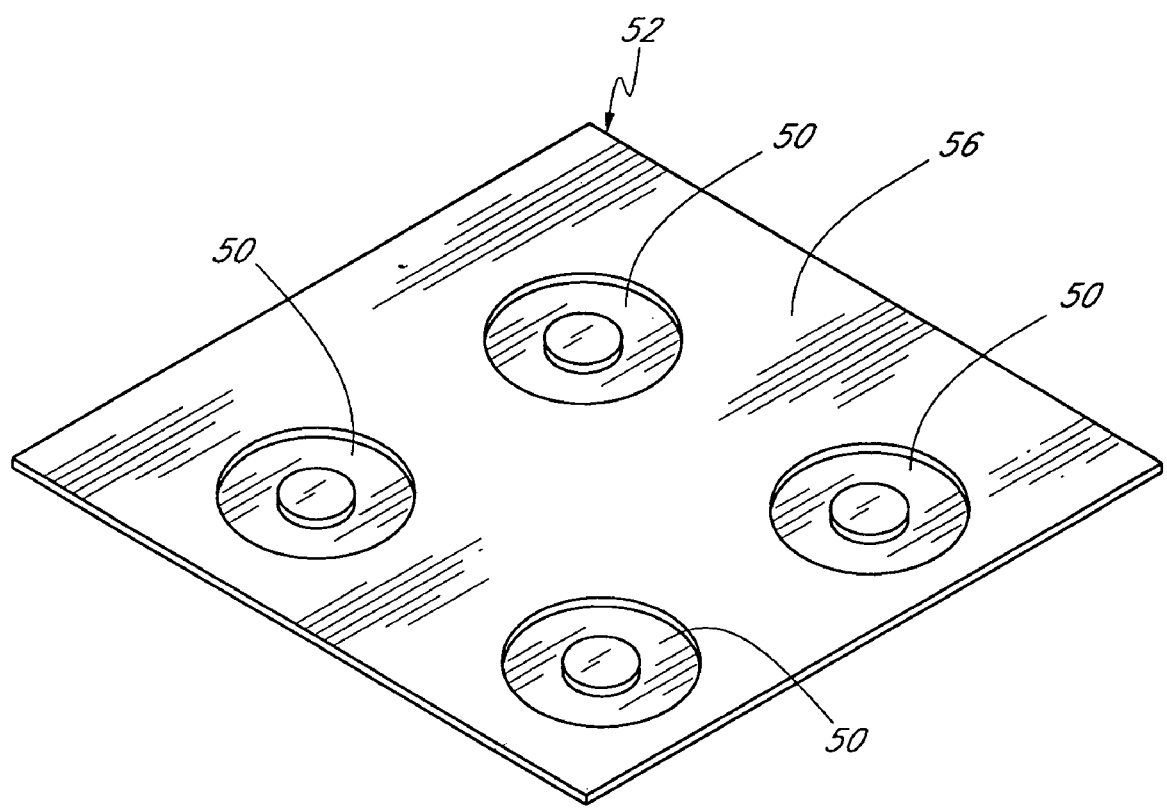
FIG. 1 is a perspective view illustrating a support panel with a plurality of toroidal cavity openings routed therein.
Figure 3:
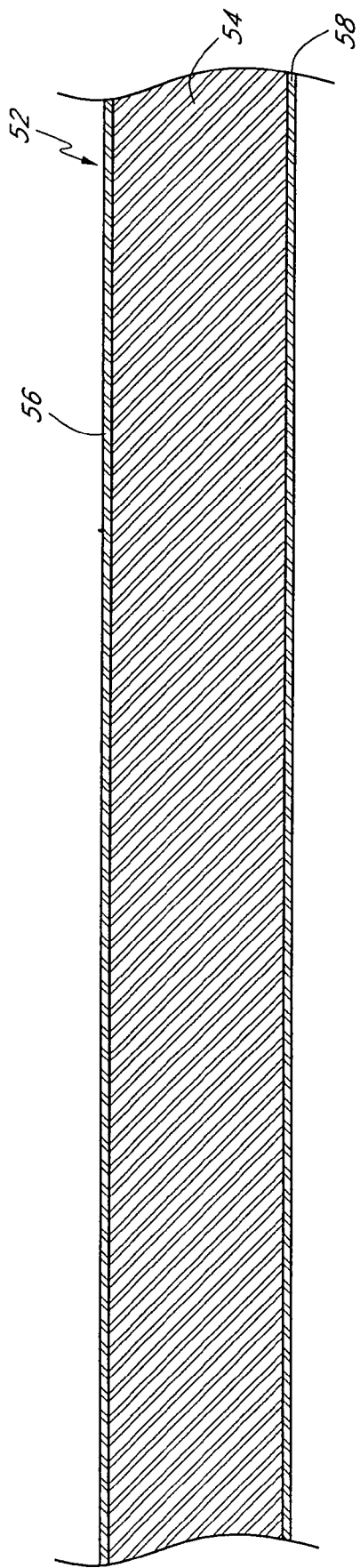
FIG. 3 is a cross-sectional view of the support panel having copper layers on opposite sides.
Figure 4:
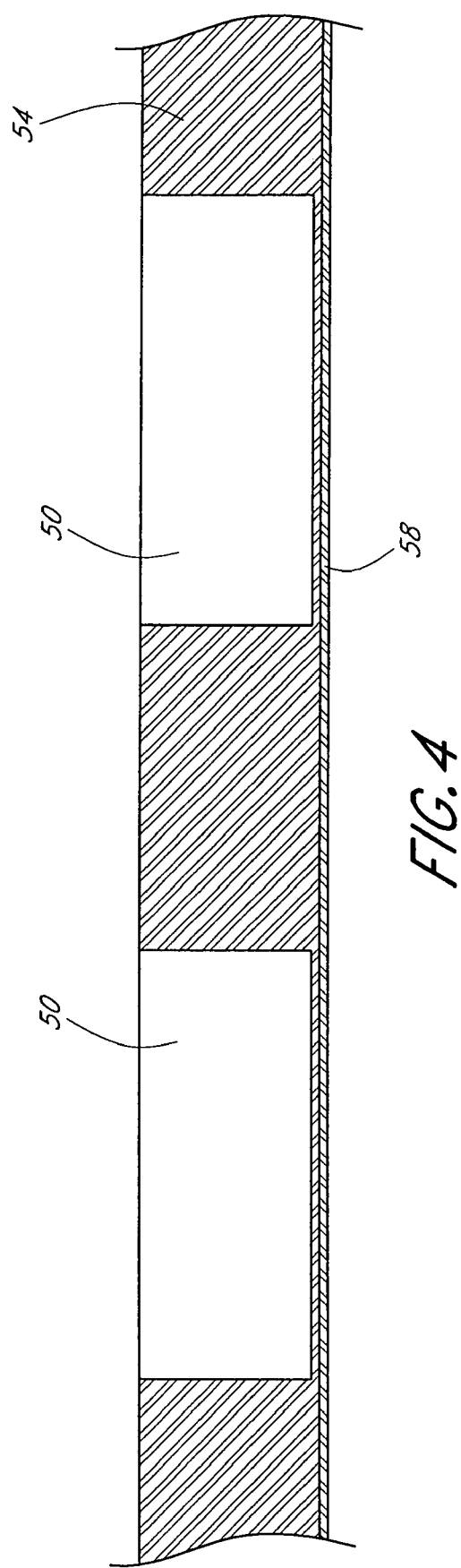
FIG. 4 illustrates a cavity and the removal of the top copper layer from the support panel.

The process for manufacturing one embodiment of inductive component devices is illustrated in FIGS. 1-22. As shown in FIG. 1, a plurality of toroidal openings or cavities 50 are formed, typically by routing, in a support panel 52. Panel 52 is advantageously an FR-4 epoxy laminate sheet 54 with copper layers 56, 58 on opposite sides, as shown in FIG. 3, although it will be apparent that sheets made from other materials including other types of sheets used for circuit board fabrication and rigid flex are applicable for use as support panel 52. Using standard techniques of printed circuitry, the top copper layer 56 is then eliminated using the dry film to mask the bottom surface of the support panel. The exposed (unmasked) copper layer 56 is then etched off from the top surfaces of the panel. The remaining dry film mask is then stripped from the bottom surface to provide a support panel having the cross-section shown in FIG. 4.

Figure 2A:
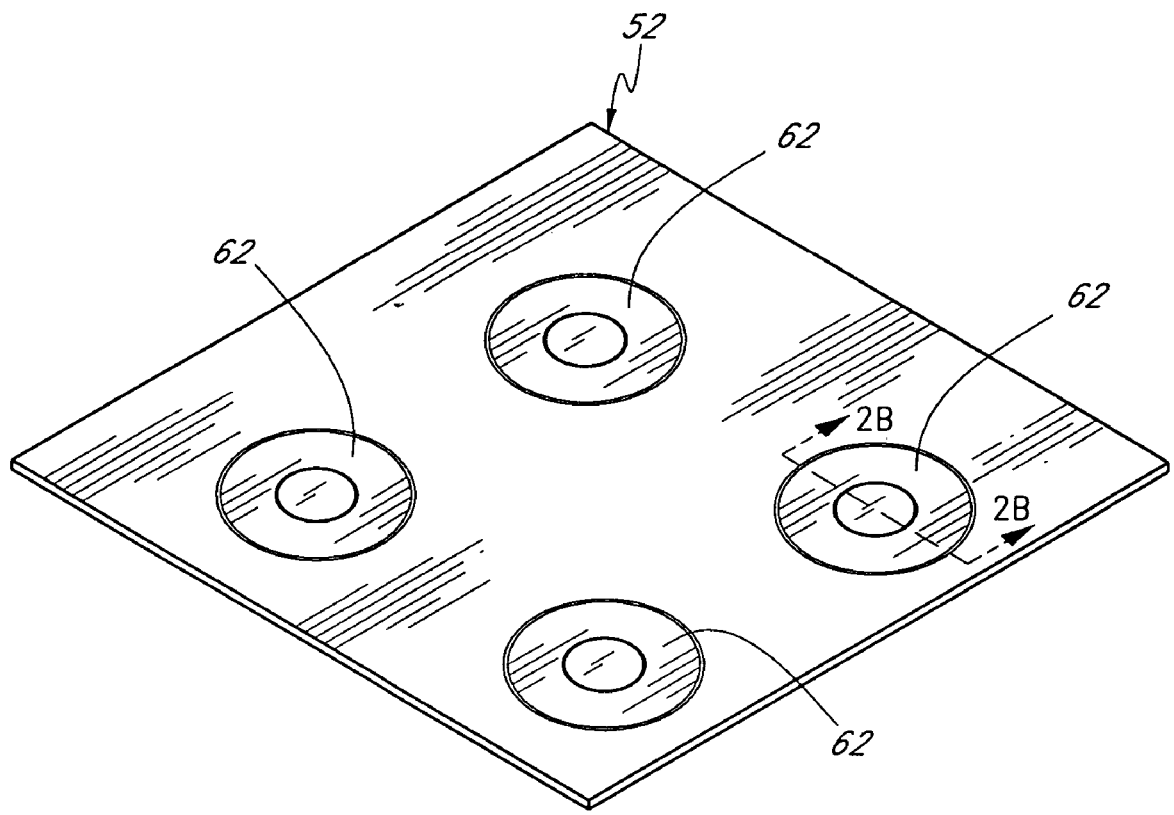
FIG. 2A is a perspective view illustrating embedded ferrite toroids in each of the routed cavity openings in the support plate.
Figure 23:
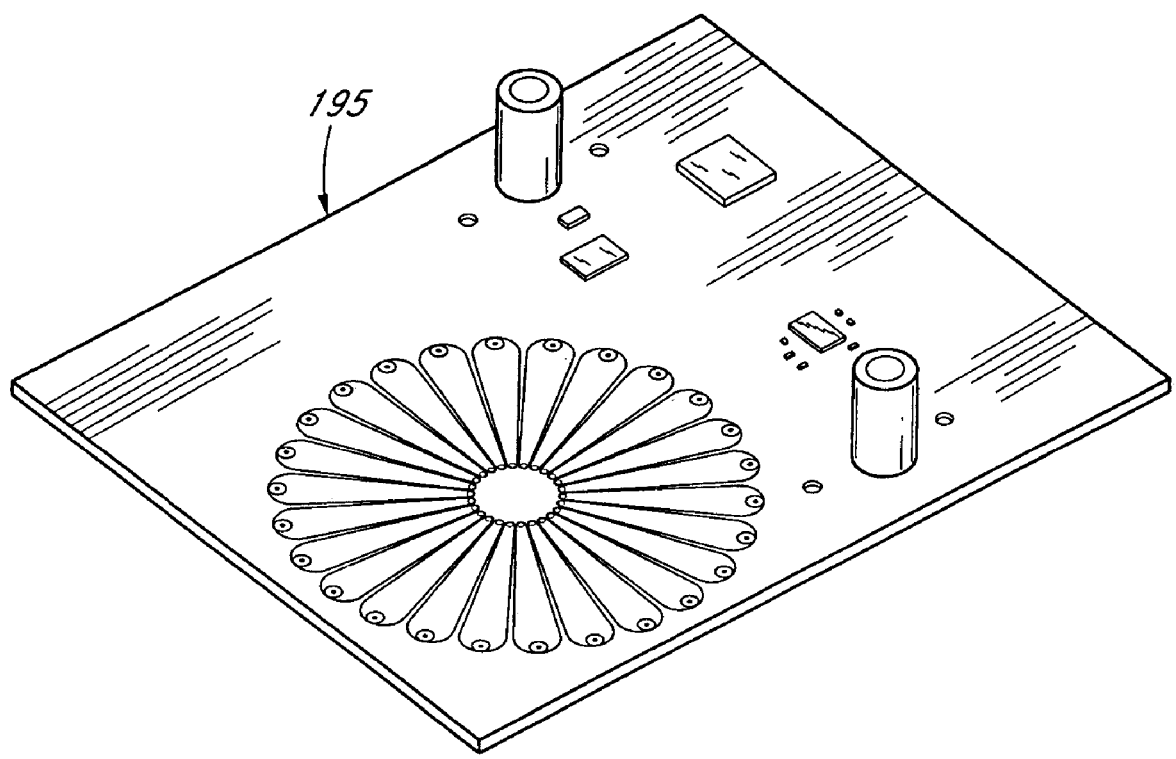
FIG. 23 is a perspective view of a power supply in which the inductive elements are embedded in the printed circuit panel.
Figure 34A:
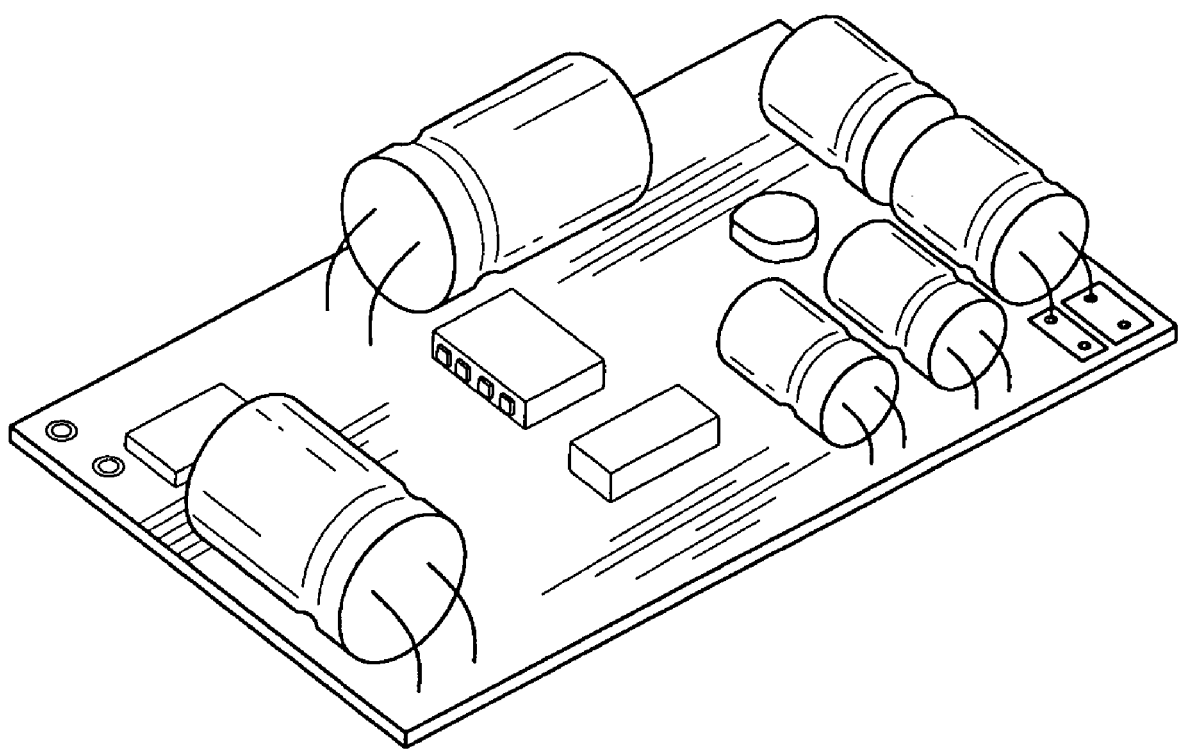
FIGS. 34A and 34B are perspective views of the top and bottom of a power supply constructed utilizing the printed circuit level shown in FIGS. 31A, 31B, 32A, 32B, and 33A, 33b.
Figure 34B:
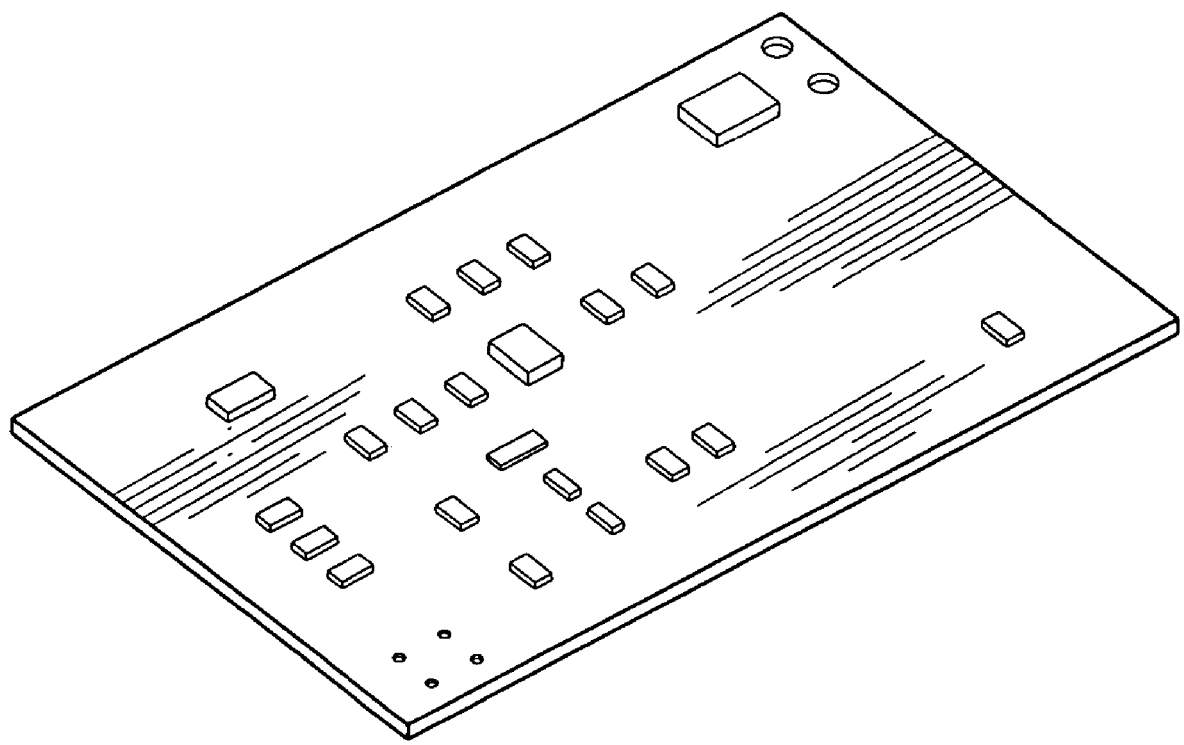

FIGS. 1 and 2A illustrate a support panel 52 on which four cavities are formed to simultaneously manufacture four inductor or four transformer components after which the support board is cut or mounted to produce a plurality of individual components such as illustrated in FIGS. 23, 34A, and 34B. It will be understood that the processes described below are usually used to simultaneously manufacture a larger number of components, typically in the range of 16 to 20 components. Also, each component may include a single cavity embedding a single magnetic toroid or may include two or more such cavities and toroids to produce two or more embedded inductive devices for a particular electronic device. See, e.g., the power supply described below and shown in FIGS. 34A and 34B.

Figure 5:
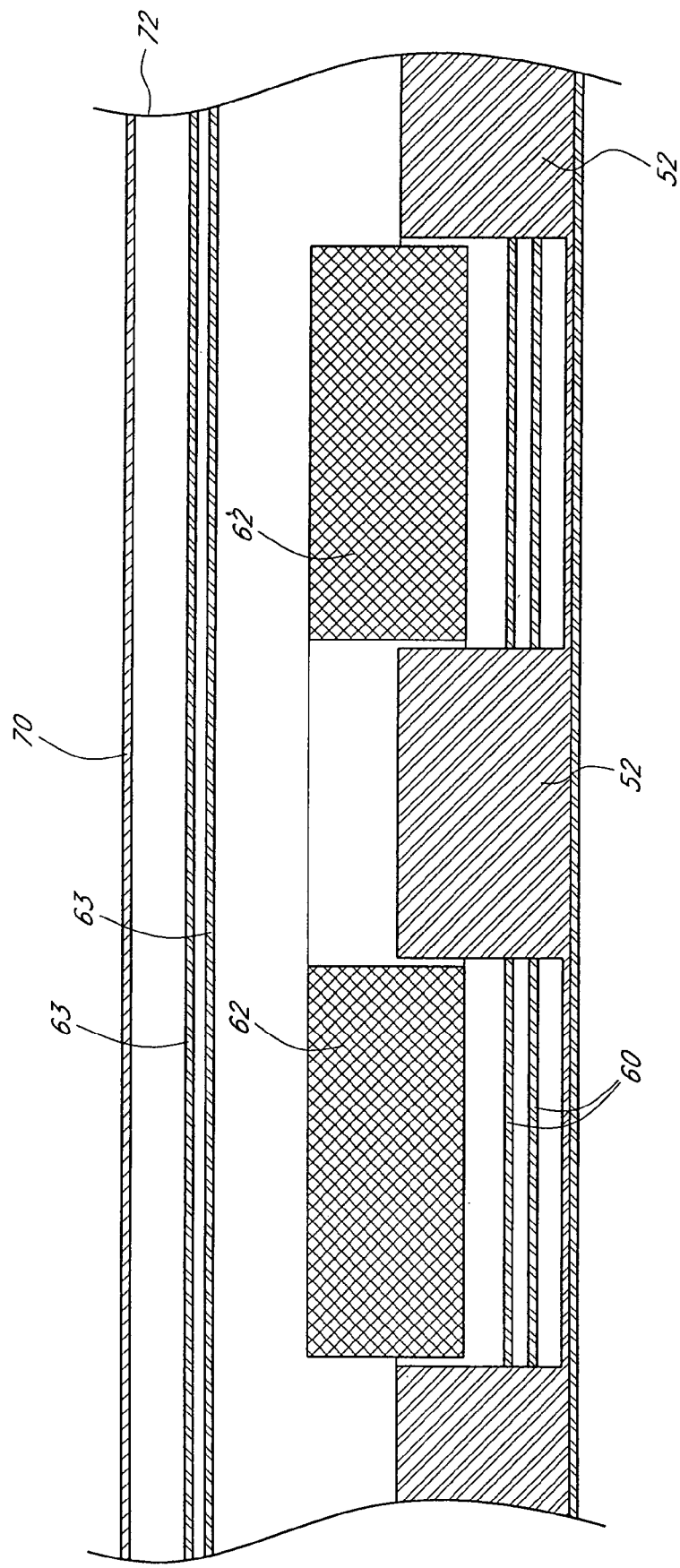
FIG. 5 is a cross-sectional view illustrating the lay-up prepreg rings and prepreg copper foil lamination.
Figure 6:
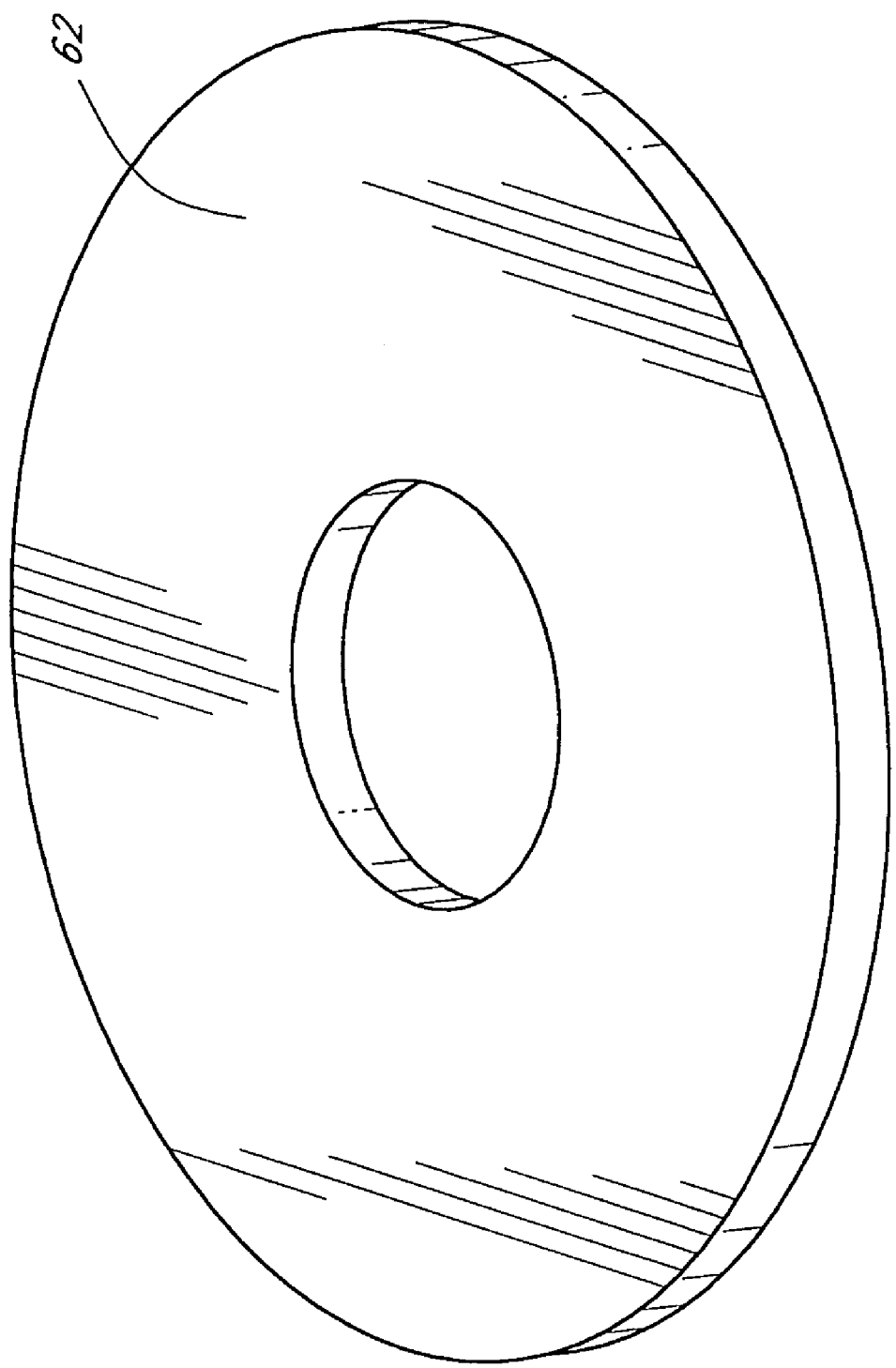
FIG. 6 is a perspective view of the toroid ferrite.
Figure 7:
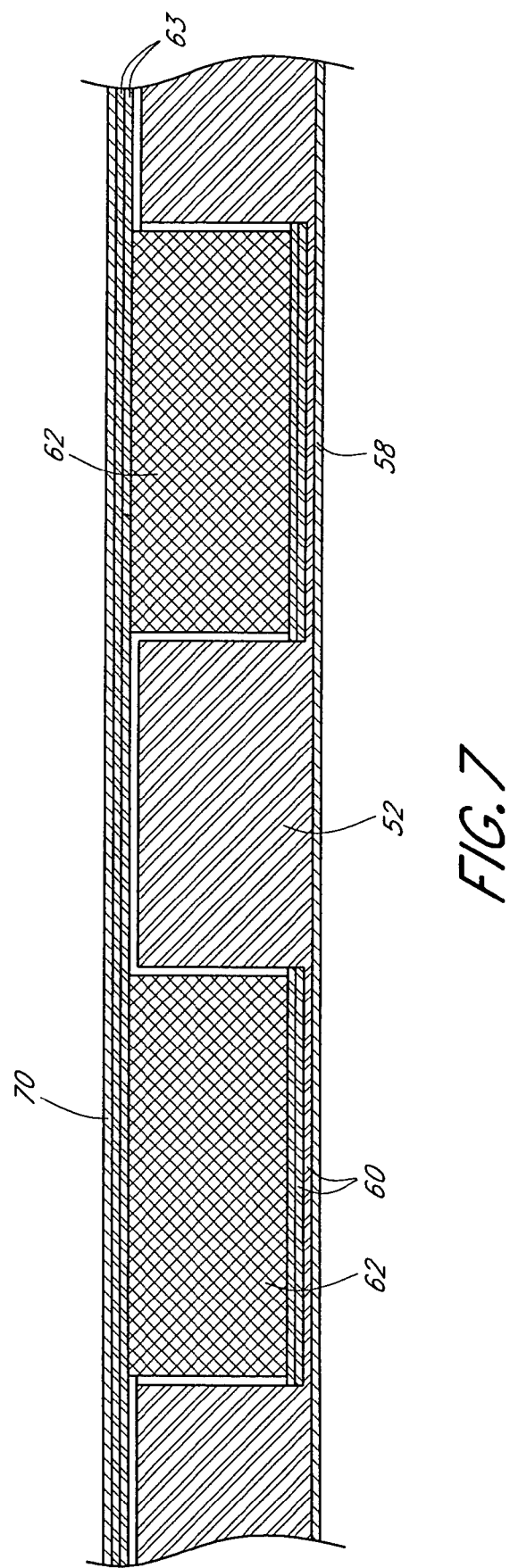
FIG. 7 is a cross-sectional view showing the assembly prior to the lamination of the copper foil.

Following the cavity preparation, one or more prepreg toroidal rings 60 are seated onto the bottom of each of the formed toroidal openings 50 as shown in FIG. 5.

Figure 2B:
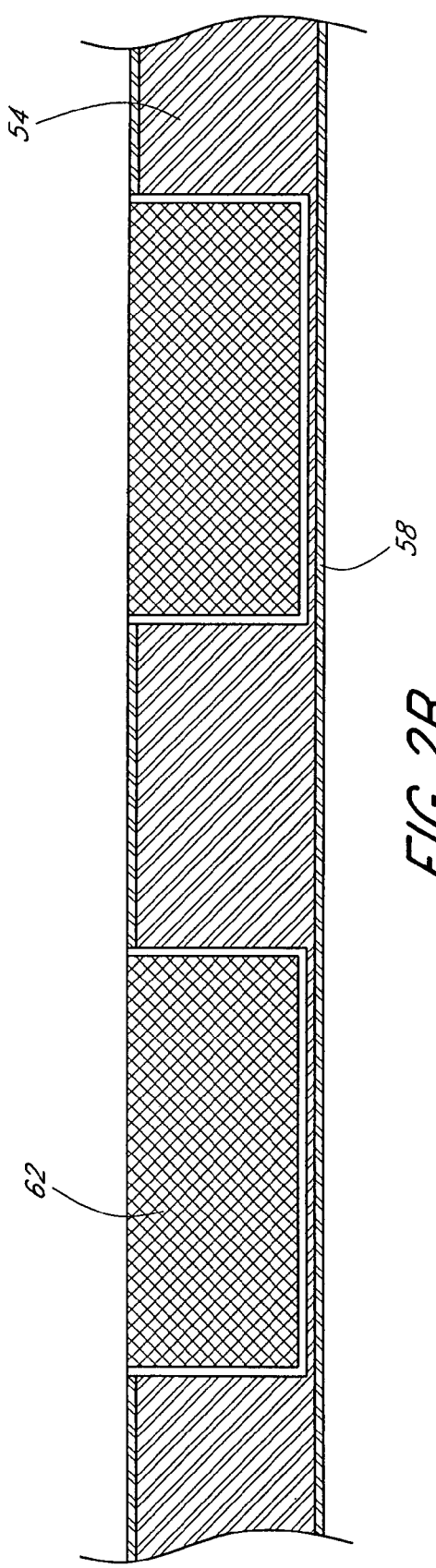
FIG. 2B is a cross-sectional view along lines 2B-2B of FIG. 2A.

Ferrite toroids 62 (shown in FIG. 6), are then respectively embedded within the openings 50, as shown in FIGS. 2A and 2B. Each of these ferrite toroids 62 serve as a ferromagnetic slab for a fabricated inductive component. By way of specific example, the toroid may have an outside diameter of 1.25 inches and an opening of ⅜ inches. A copper foil 70, is then laminated to the top surfaces of the ferrite toroid 62 using an epoxy prepreg 72 or other suitable adhesive to affix the foil to the ferrite plate. Depending upon the ultimate application of the inductive component, the copper foil will typically also cover all or part of the support panel 52.

The lay-up of the prepreg rings 60, ferrite toroids 62 and lay-up prepreg 63 and copper foil 70 is illustrated in FIG. 5. The laid-up subassembly is shown in FIG. 7A.

Figure 8:
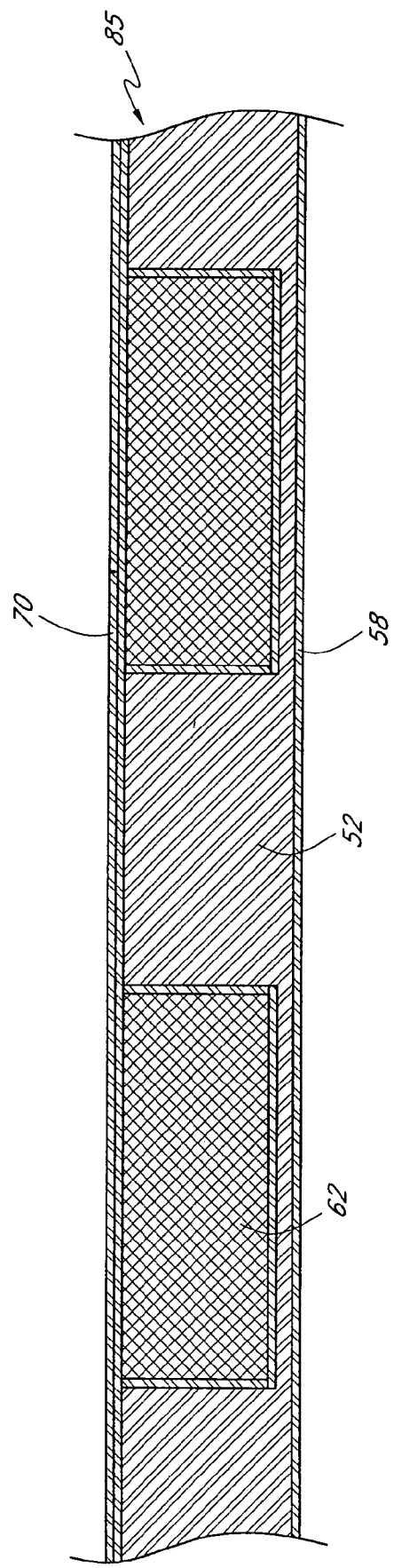
FIG. 8 is a cross-sectional view showing the assembly after lamination of the copper foil.
Figure 9:
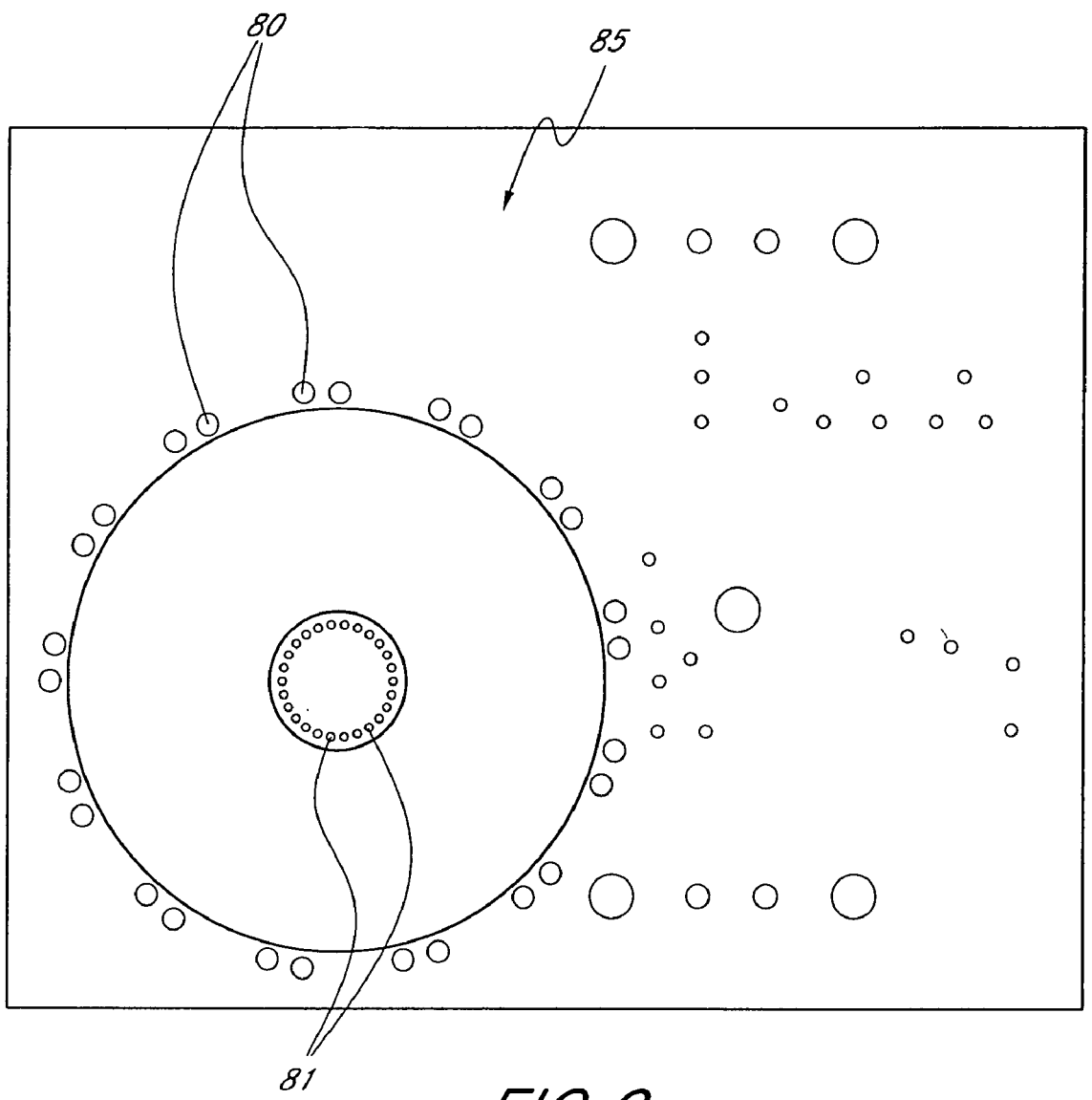
FIG. 9 is a top elevational view showing the through via holes formed around the outer and inner walls of the ferrite core.
Figure 10:
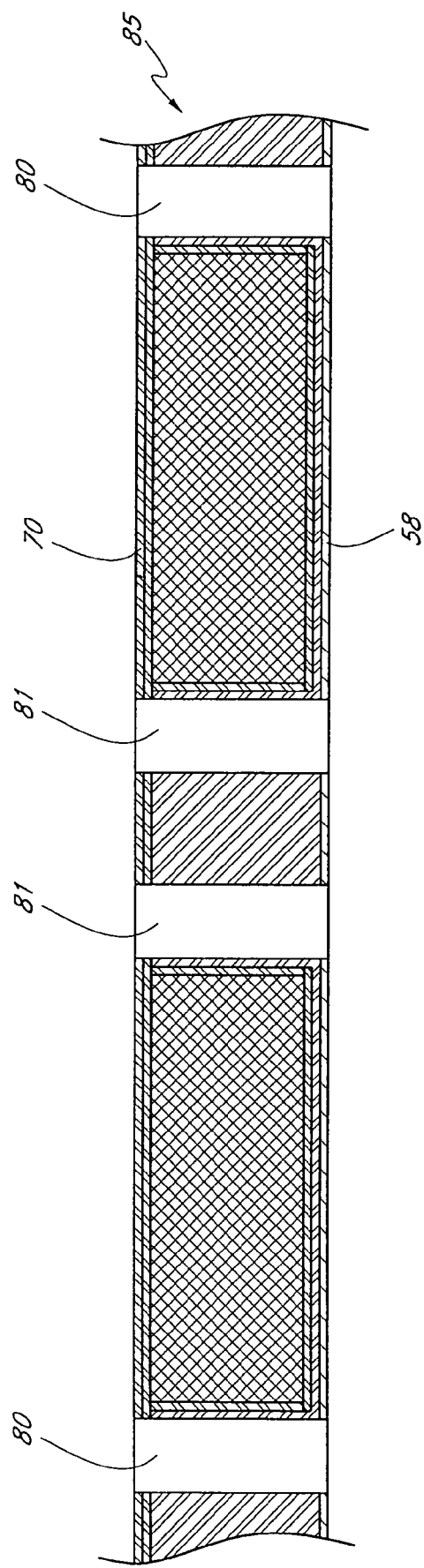
FIG. 10 is a cross-sectional view of the via holes.

As illustrated in FIG. 7B, panel 52 and assembled ferrite toroids, prepreg and copper foil are then placed in a holding fixture of a laminating machine (not shown) that applies pressure and heat resulting in the top surfaces of the ferrite cores 62 being made substantially flush with the top surfaces of board 52 and prepreg material filling the voids between the walls of openings 50 and ferrite cores as well as laminating the copper foil 70 over the cores 62 and support panel 52 as shown in FIG. 8. The resultant flat surface over the embedded toroid ferrite permits multiple additional circuit layers and mounting of circuit elements over the entire support panel 56. As described below, extremely small components such as switching power supplies and battery chargers for laptops, computers, digital cameras, cell phones, portable audio and TV's and the like can be constructed.

In this lamination step and the lamination steps described below, the materials used are selected to provide the desired physical properties for the finished circuitry. These properties are commonly referred to as peel strengths and bond strengths. The preferred materials for laminating are: Medium or High Tg epoxy prepregs from LG, Isola, Polyclad or Arisawa.

Through holes (vias) 80 and 81 are then respectively drilled through the laminated subassembly panel 85 around the outside and inside of ferrite toroids using conventional drilling equipment. These via holes are typically 12 to 50 mils in diameter. As described below, these through holes or vias 80 and 81 (shown in FIGS. 9 and 10) enable fabrication of plated through hole conductors which function as electrical windings for the inductor or transformer device.

After drilling, the laminated panel 85 is advantageously plasma etched to clean the drilled holes. This step is advantageously followed by a glass etch to remove spurious glass particles from the holes 80, 81 or roughen the glass fibre for adhesion of the copper plating followed by chemically cleaning the vias 80, 81 and the top and bottom surfaces of the exposed copper sheets 58 and 70.

A conventional process is then used to chemically coat the inside surface of all of the through holes 80, 81. In one embodiment, the SHADOW process is utilized. Other processes include an electroles copper deposition and DMSE/HDI process. An article describing the process entitled "The Reliability of PTH Printed Wiring Boards Manufactured With a Graphite-Based Direct Metallization Process" is included with this application as Appendix A.

Figure 11:
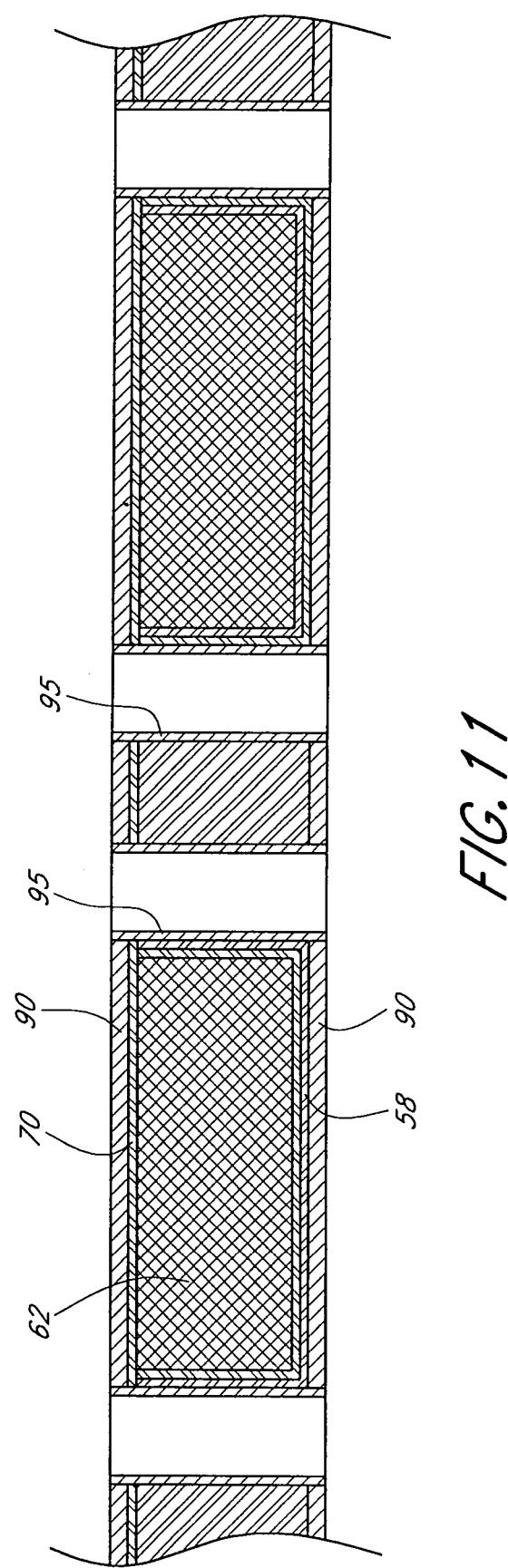
FIG. 11 is a cross-sectional view illustrating copper plating of the assembly.

Following this application of the chemical coating, the subassembly 85 is copper plated. The plated copper 90 is shown in FIG. 11 and covers both the copper foil laminate 58, the copper foil laminate 70 and the internal walls of the through holes (vias) 80, 81 (shown at 95) so as to electrically connect the top and bottom copper foils 58, 70 via the plated through holes 95.

Printed circuits 100, 101 (shown in FIGS. 12A and 12B) are then fabricated using the top and bottom layers of the copper laminate 58, 70 and plated copper 90. These circuits 100, 101 are advantageously formed by vacuum laminating a dry photographically developable film over the surfaces of the plated copper on the top and bottom of the subassembly. Using standard, well known techniques of printed circuitry, first layer 100 and second layer 101 of circuitry are fabricated by using the dry film to mask the desired circuitry. The exposed, i.e., unmasked copper is then etched from both top and bottom surfaces of the component assembly. The remaining dry film mask is then stripped from those top and bottom surfaces. The remaining copper forms a first layer of circuitry 100 on the top surface (shown in FIG. 12A), and a second layer of circuitry 101 (shown in FIG. 12B) on the bottom surface, interconnected by the copper plated via holes 95. As described below, these formed printed circuits respectively include circuits 100, 101 which are respectively connected at each end to a plated through hole 80, 81 to provide a continuous, electrical winding around the ferrite core encased in the support member. These windings and ferrite core form a miniature inductor transformer.

The top and bottom surfaces are then chemically cleaned. The component assembly is then vacuum baked to remove any remaining moisture.

The component assembly is then prepared for an additional copper layer and an additional plated via insulated from but fabricated over the first copper layers. An insulating coating is used to separate the multiple layers of circuitry and plated vias. Epoxy, polymer, liquid polyamide and other materials may be used. However, parylene coating has been discovered to be particularly advantageous for forming these insulating layers. Parylene is an organic coating with an inert surface. In one embodiment, in preparation for the parylene coating, an adhesive promotor such as a very thin Silane, Carboxyl or Silane and Carboxyl layer 110 (shown in FIG. 13) is deposited on the subassembly including the top and bottom surfaces and walls of the plated through holes using a PECVD process (Plasma Enhanced Chemical Vapor Deposition) or other suitable process. In another embodiment, this very thin layer 110 may be formed by dipping the subassembly in a Silane or other adhesive before deposition of the parylene.

Figure 14:
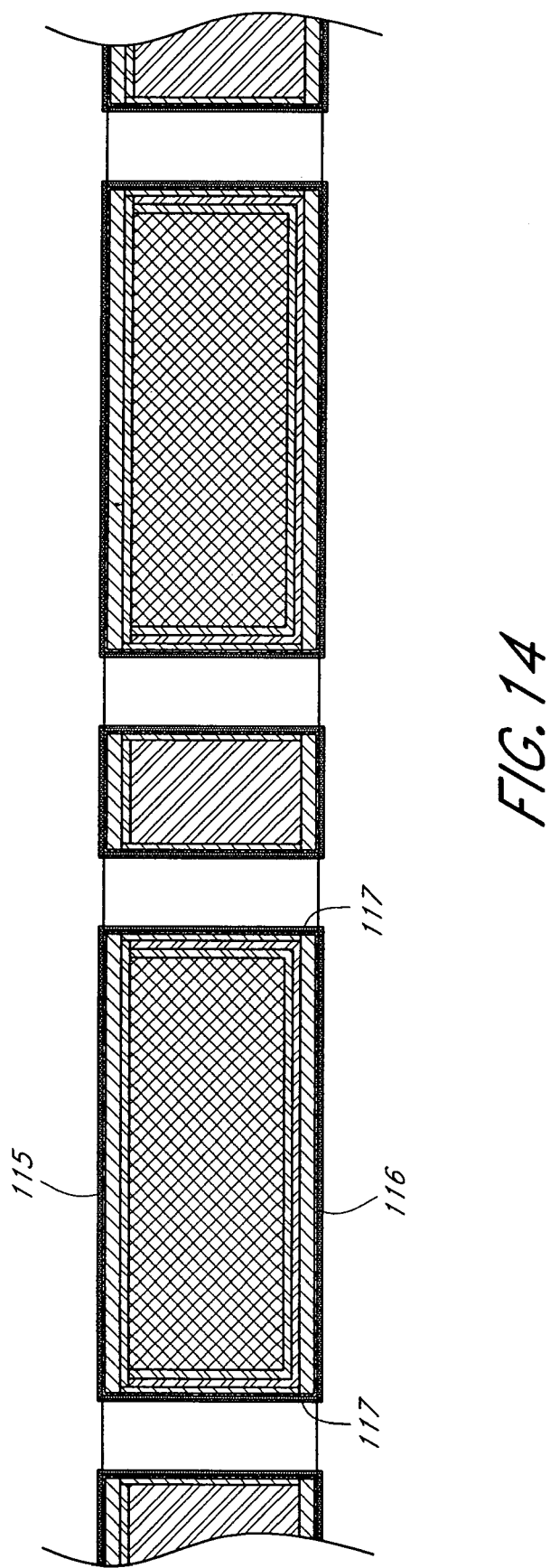
FIG. 14 is a cross-sectional view showing the application of the second insulating layer.
Figure 15:
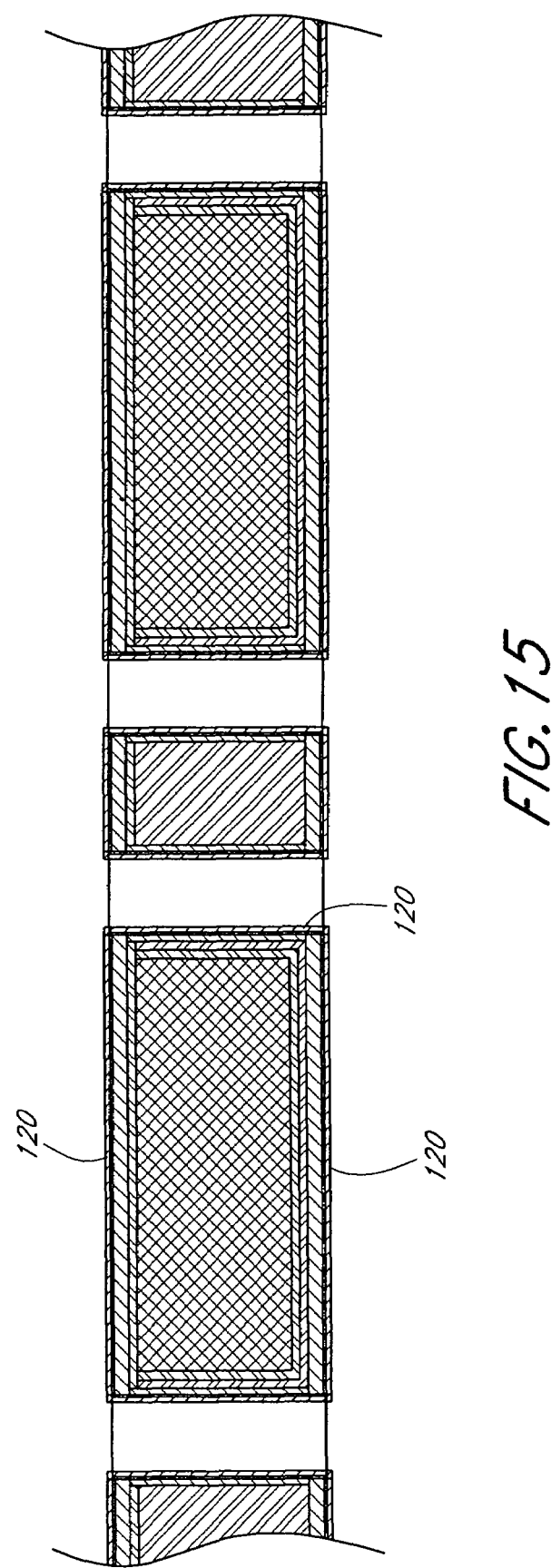
FIG. 15 is a cross-sectional view showing the application of the third insulation layer and adhesion promotor.

The parylene is then vacuum deposited over the entire subassembly to leave, as illustrated in FIG. 14, a thin coating 115 over the first (top) layer of circuitry 100, a thin coating 116 over the second (bottom) layer of circuitry 101 and a thin coating 117 over (inside) the copper plated through hole 95.

The parylene coating process is further described in the publication entitled "Parylene Conformal Coatings Specifications and Properties," published by Specialty Coating Systems, Indianapolis, Ind. and attached as Appendix B to this application. This parylene coating is pinhole free and has a high dielectric strength with very thin coatings providing very high voltage breakdown values. By way of specific example, parylene coatings formed of Parylene C with thicknesses of 0.0005 mil to 0.001 mil provide a voltage breakdown guard band of about 5600 volts per mil of thickness. Parylene C has a dielectric constant of about 2.28.

Nova HT Parylene described in Appendix C to this application provides an even higher dielectric constant of about 3.15 and provides a voltage breakdown of about 750volts per micron of thickness. As a result, very thin coatings, e.g. 10 to 15 microns provides a breakdown voltage barrier in the range of 7500 volts or higher.

Figure 27:
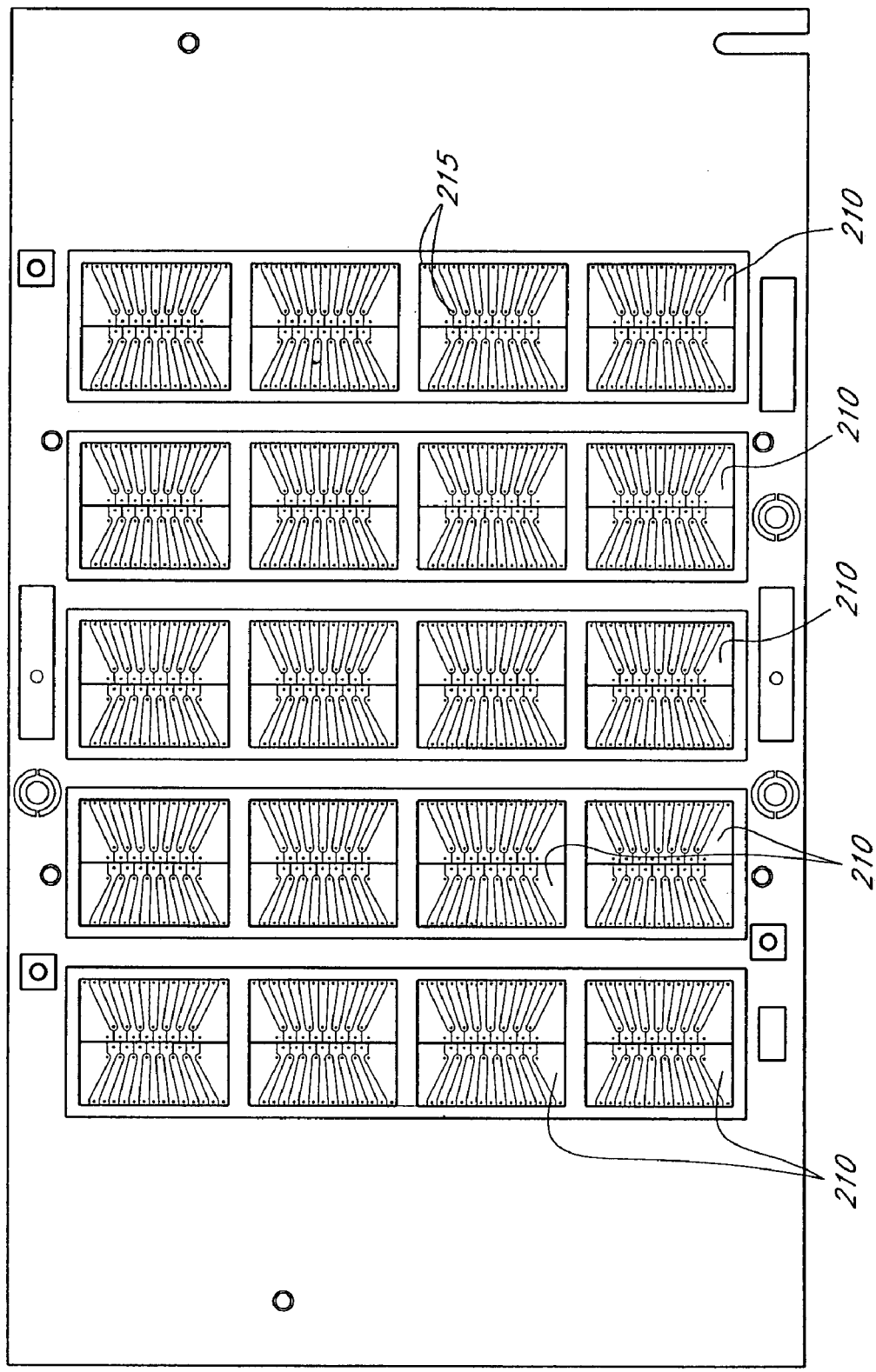
FIG. 27 is an elevation view of a subassembly illustrating the transparency of the parylene insulating layer.
Figure 28:
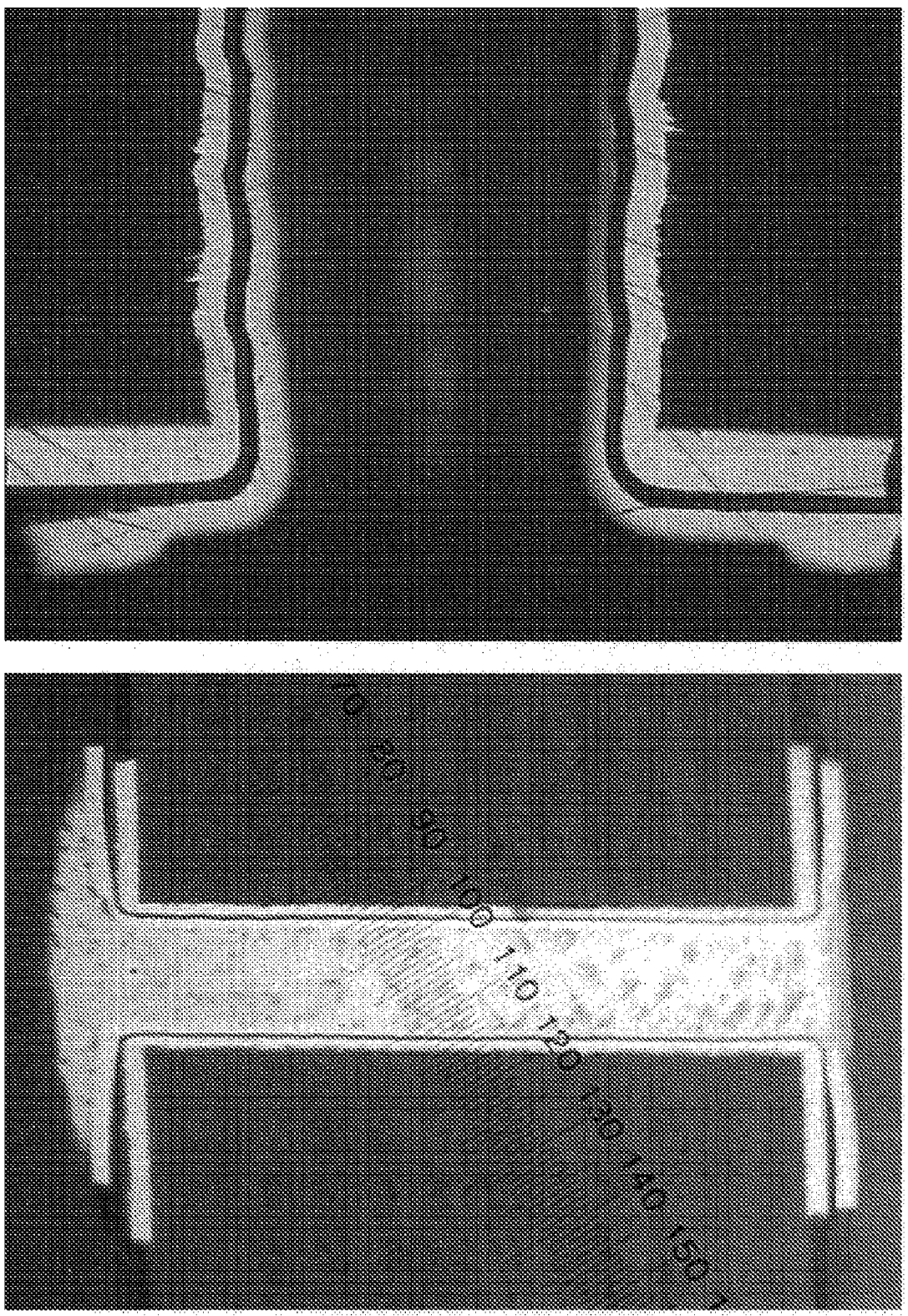
FIG. 28 is a photomicrographic view of an exemplary cross-section showing two parylene insulated conductive vias in a single via hole as formed by this invention.

A parylene coated subassembly is shown in FIG. 27. This and other parylene coatings shown in other photographs were coated at the SCS Coating Center at Ontario, Calif., as described in Appendix D to this application.

The thickness of the deposited parylene layers 115, 116 and 117 is determined by several factors including physical size of the manufactured inductor or transformer, physical size of the through hole openings 80, 81, the number of insulated plated through hole conductors to be formed in a through hole, and the power rating of the manufactured product. For the miniature inductors and transformers described below, the thickness of the parylene layer will be in the range of about 0.5 mil to 3 mils. (0.0005 to 0.003 inches), and the breakdown guard band will be in the range of about 5600 to 15,000volts per mil of thickness of the parylene layers.

The extremely thin parylene provides a high dielectric coating between the copper plated through holes and enables plural such through hole conductors to be formed in a very small through hole opening. A further aspect of the these coatings that enables multiple conductors through a single very small via is that the vacuum deposited parylene provides a substantially uniform thickness coating that closely follows the contour of the underlying copper plate. As a result, the parylene does not, of itself, cause an unpredictable build up of thickness in the plated through hole. The diameter of the through holes will typically be determined by the thickness of the support panel 56 and the number of plated, through holes to be formed in each through hole. The panel thickness is typically in the range of about 62 mil to 15 mil. Typically the hole size will range from about 12 mil to 50 mil. For a panel 90 mil thick, a hole size of about 22 mil diameter will typically be used to form two plated through holes within this through hole and a hole size of about 40 mil diameter will be selected to form four plated through holes. For a thicker panel 0.125 mil thick, a hole size of about 28 mil would typically be used to form two plated through holes and a hole size of about 40 to 60 mil will typically be used to form four plated through holes.

While having excellent dielectric insulative properties, the surface of the deposited parylene will not bond or adhere to plated copper. It has been discovered, however, that a suitable adhesive promoter is accomplished by adding a positively charged moiety to the backbone of the parylene compound. This is advantageously accomplished by using the plasma enhanced chemical vapor deposition (PECVD) process. In one embodiment, the process is a Carboxl or Silane gas phase chemical reactions at low pressures (10 to 500 mT), voltages typically in the range of about 200 to 700 volts, currents typically in the range of about 3 to 7 amp and power in the range of about 6V to 2000 watts. The resulting surface (indicated at 120 in FIG. 15) populated with reactive sites, ready to receive an adhesive or coating. The mechanism is believed to be primarily due to hydrogen bonding and covalent bonding due to this adhesive or coating reacting to the changed moiety.

Figure 12A:
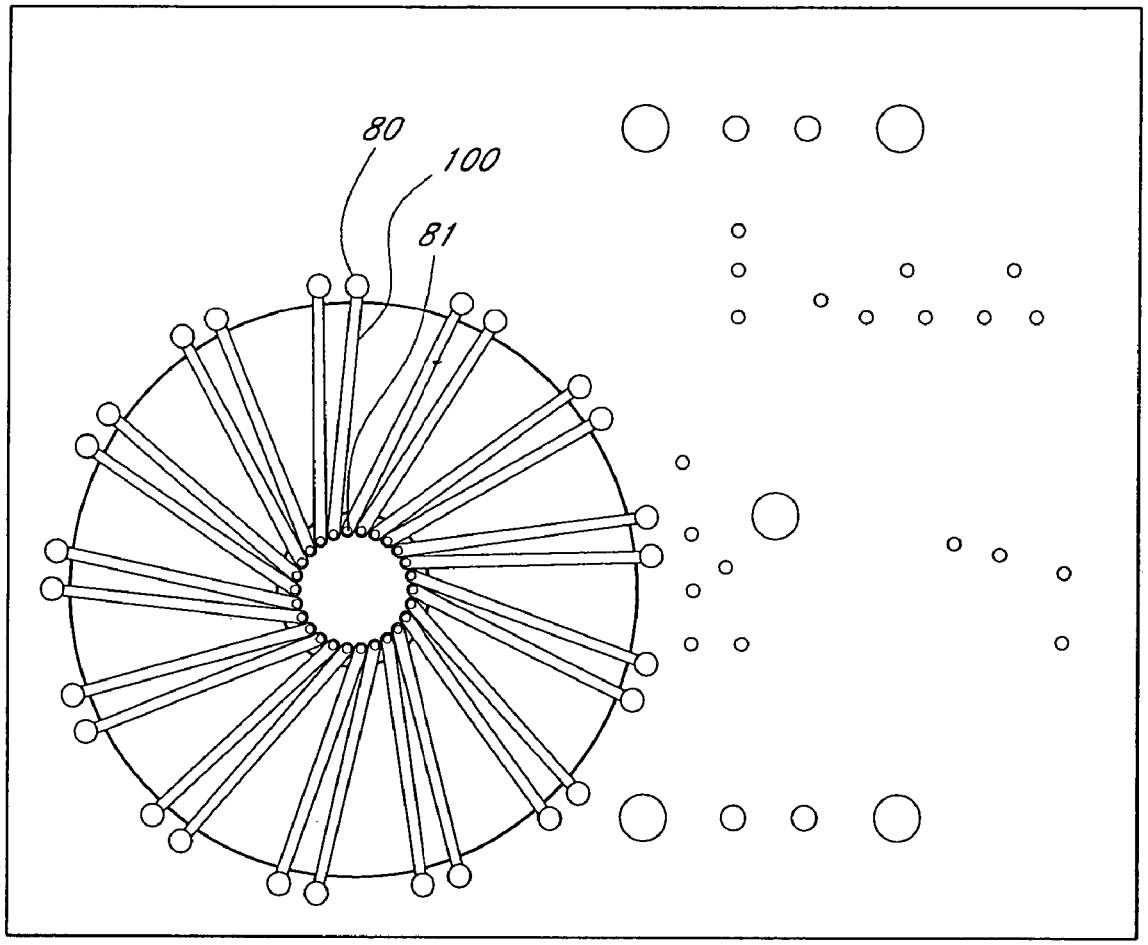
FIG. 12A is a top elevational view showing the first layer of printed circuit conductors.
Figure 12B:
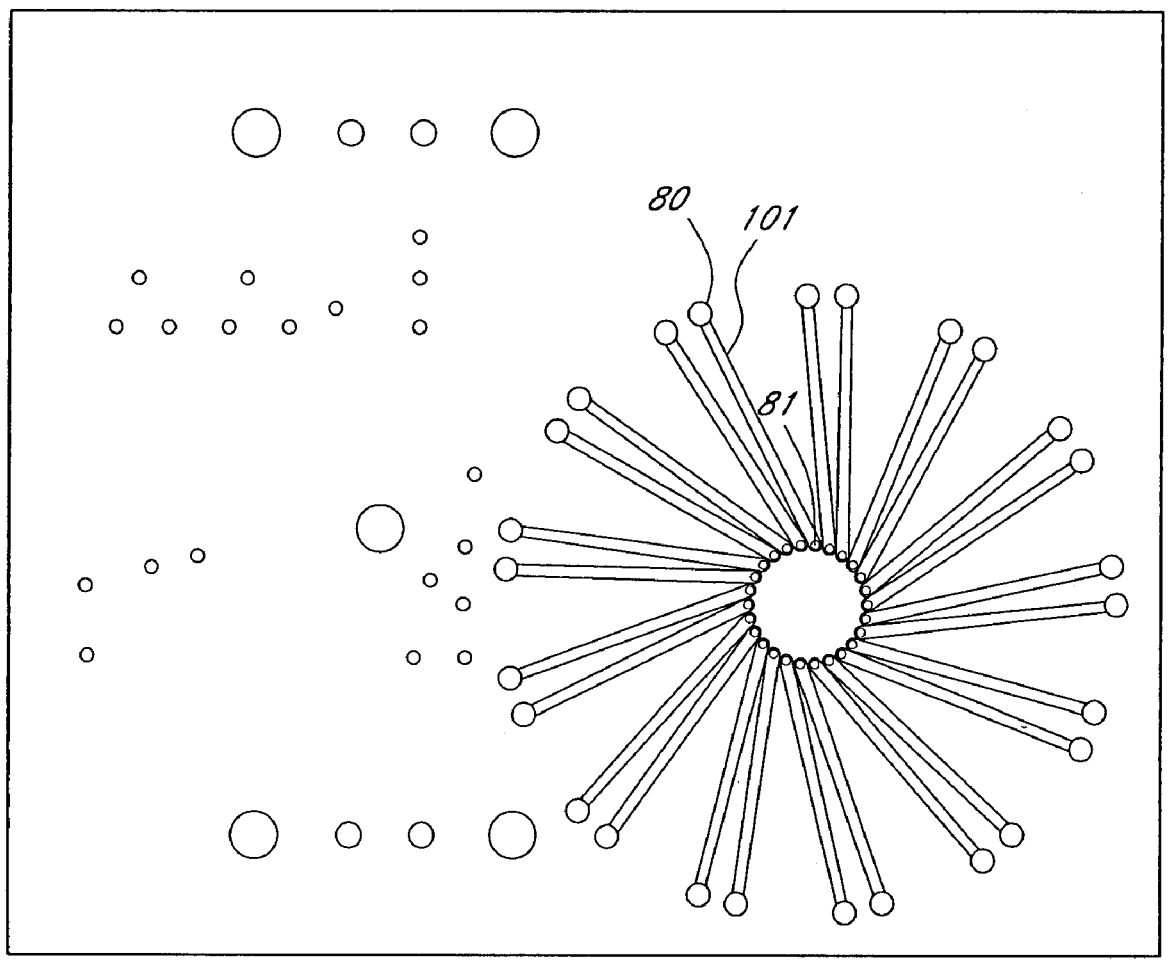
FIG. 12B is a bottom elevation view showing the second layer printed circuit conductors.
Figure 13:
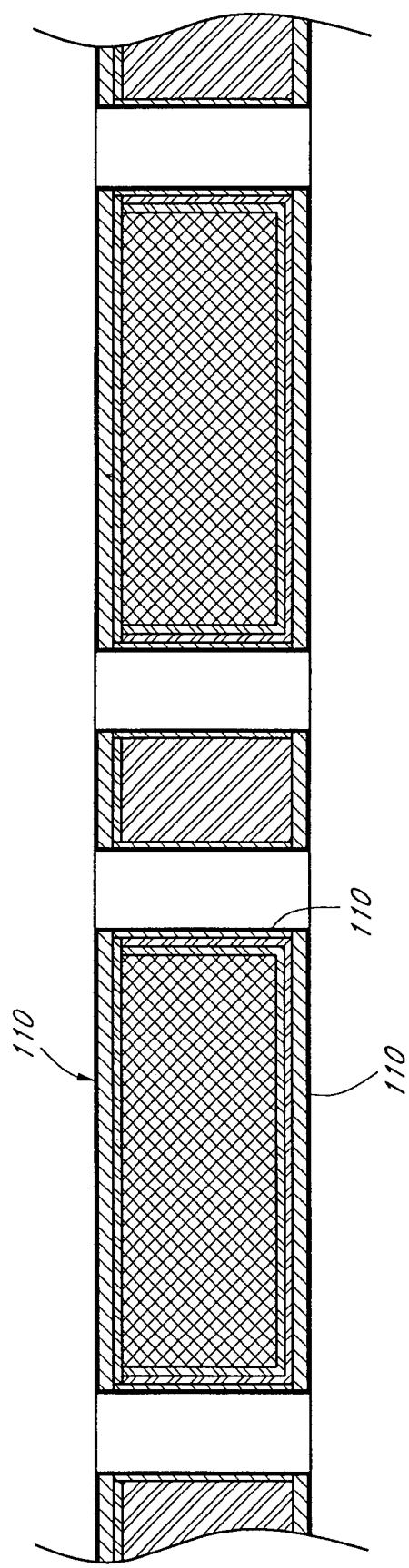
FIG. 13 is a cross-sectional view showing application of the first insulating layer over the first and second layers of printed circuit and over the first plated through hole.
Figure 16:
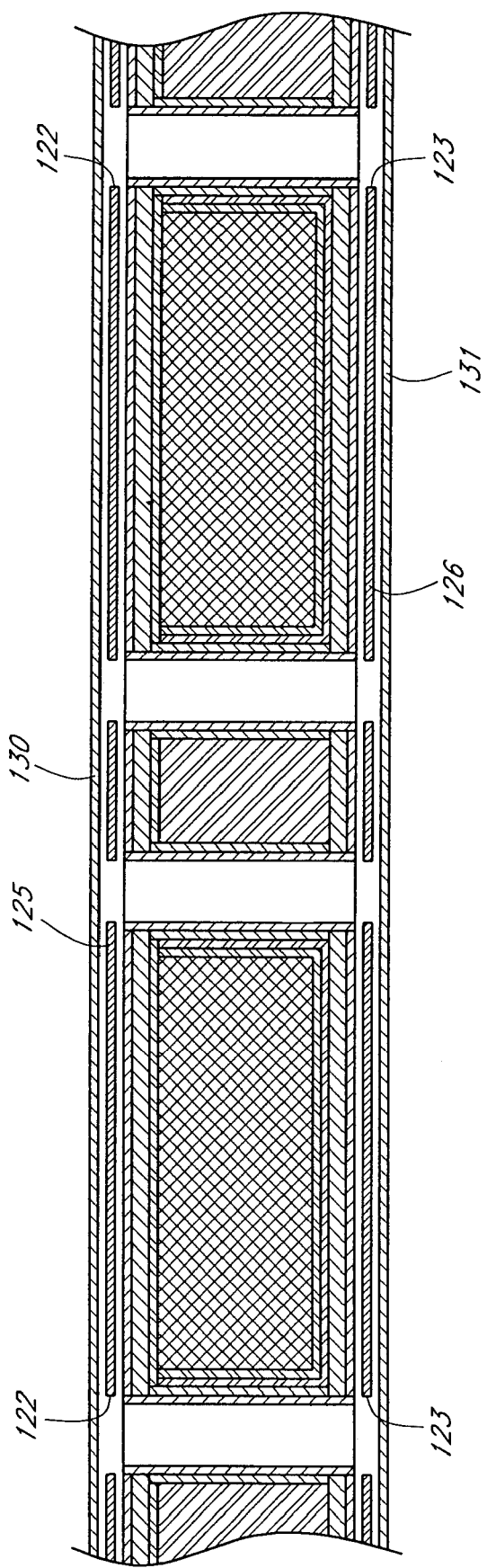
FIG. 16 is a cross-sectional view illustrating the lay-up of predrilled bond ply and copper foils.

Formation of third and fourth layers of circuitry begins with drilling hole openings 122, 123 in adhesive sheets 125, 126 before these sheets are positioned onto the assembly. These openings 122, 123 are drilled to register over the first and second layer circuitry openings 80, 81. As shown in FIG. 16, the pre-drilled adhesive sheets 125 and 126 are then respectively positioned over the top and bottom surfaces of the subassembly. A low temperature lamination process is then used to partially laminate the pre-drilled adhesive sheet 125, to the surface of the parylene coated top surface of this top circuitry layer 100 and adhesive sheet 126 to the surface of the parylene coated bottom circuitry layer 101, as shown in FIG. 12B. Copper foil 130, is then attached to the top side of the adhesive coated panel and copper foil 131 is attached to the bottom side of the adhesive coated panel.

Figure 17:
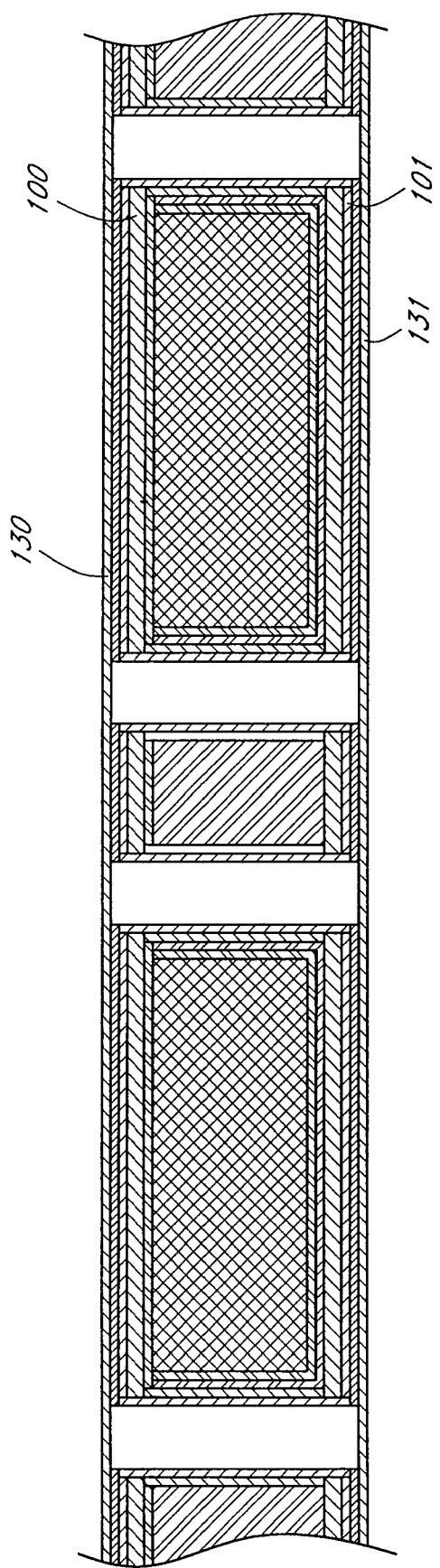
FIG. 17 is a cross-sectional view showing the assembly after lamination of the copper foils.
Figure 18:
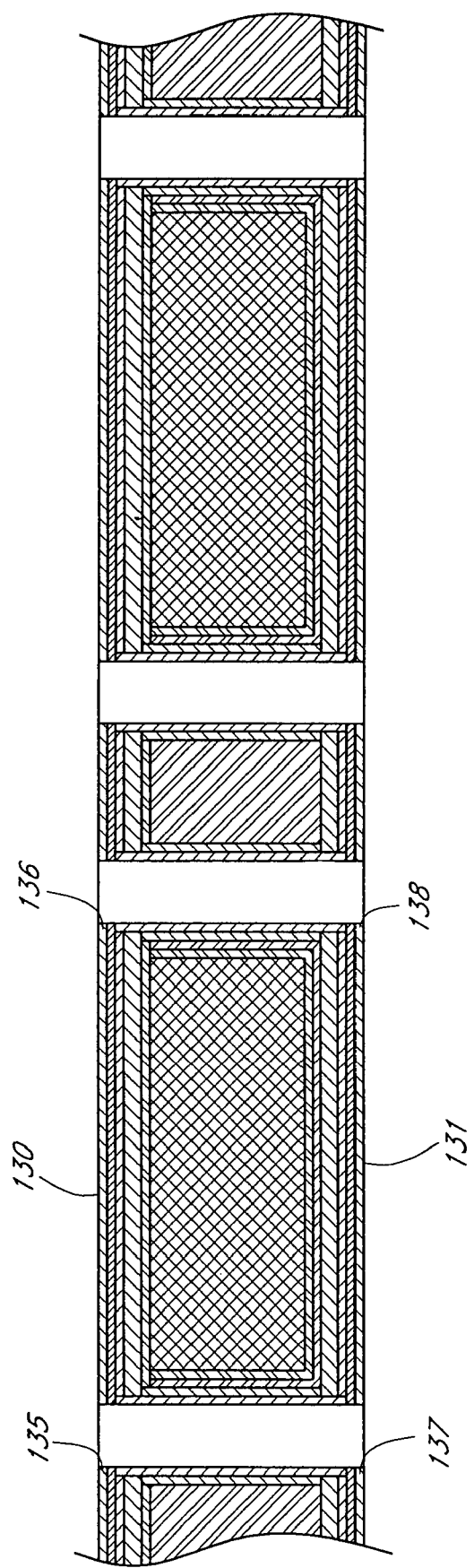
FIG. 18 is a cross-sectional view showing transformer via holes etched from the copper foils.

Copper foils 130, 131 are then laminated to the subassembly at high temperature and pressure to form a four copper layer assembly shown in FIG. 17 with the third layer 130 and the fourth layer 131, respectively, insulated from the circuitry layers 100, 101 by the insulating layers 110, 115, 116, 120.

Using the well known techniques of printed circuitry, via holes 135, 136, 137, and 138 (shown in FIG. 18) are formed in the copper foils 130, 131 by using the dry film to mask the copper. The unmasked copper is then etched from both top and bottom surfaces of the component assembly to form these vias 135-138. The remaining dry film mask is then stripped from those top and bottom surfaces.

Figure 19:
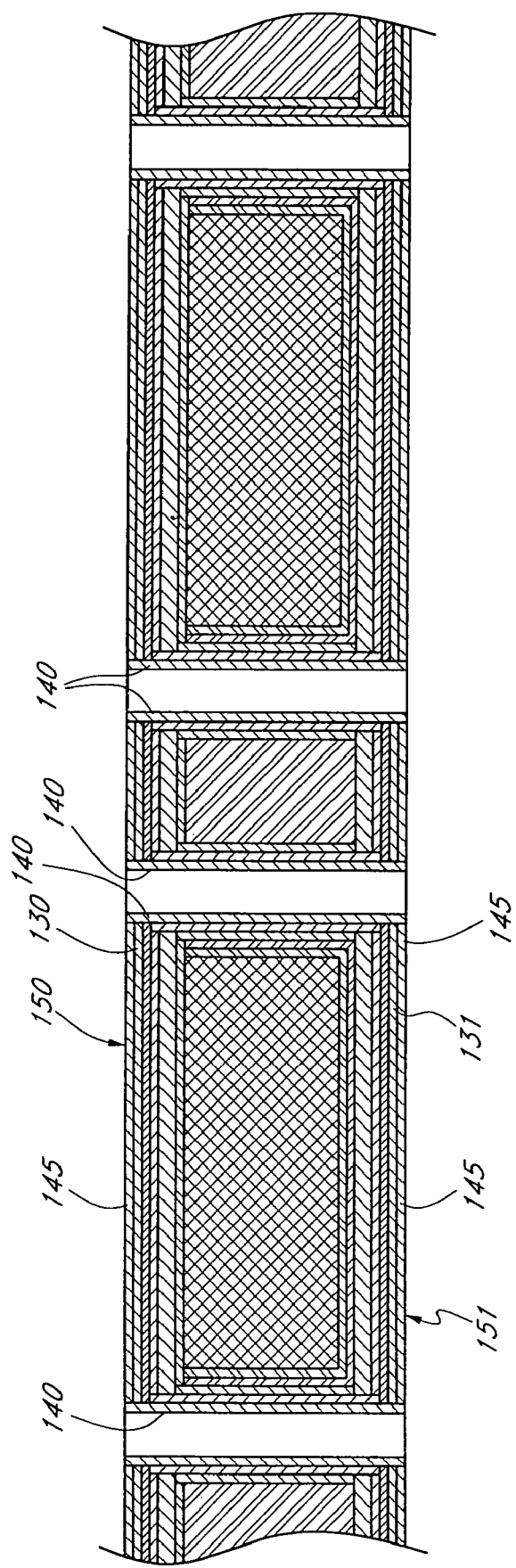
FIG. 19 is a cross-sectional view showing the copper plating over the assembly.
Figure 20:
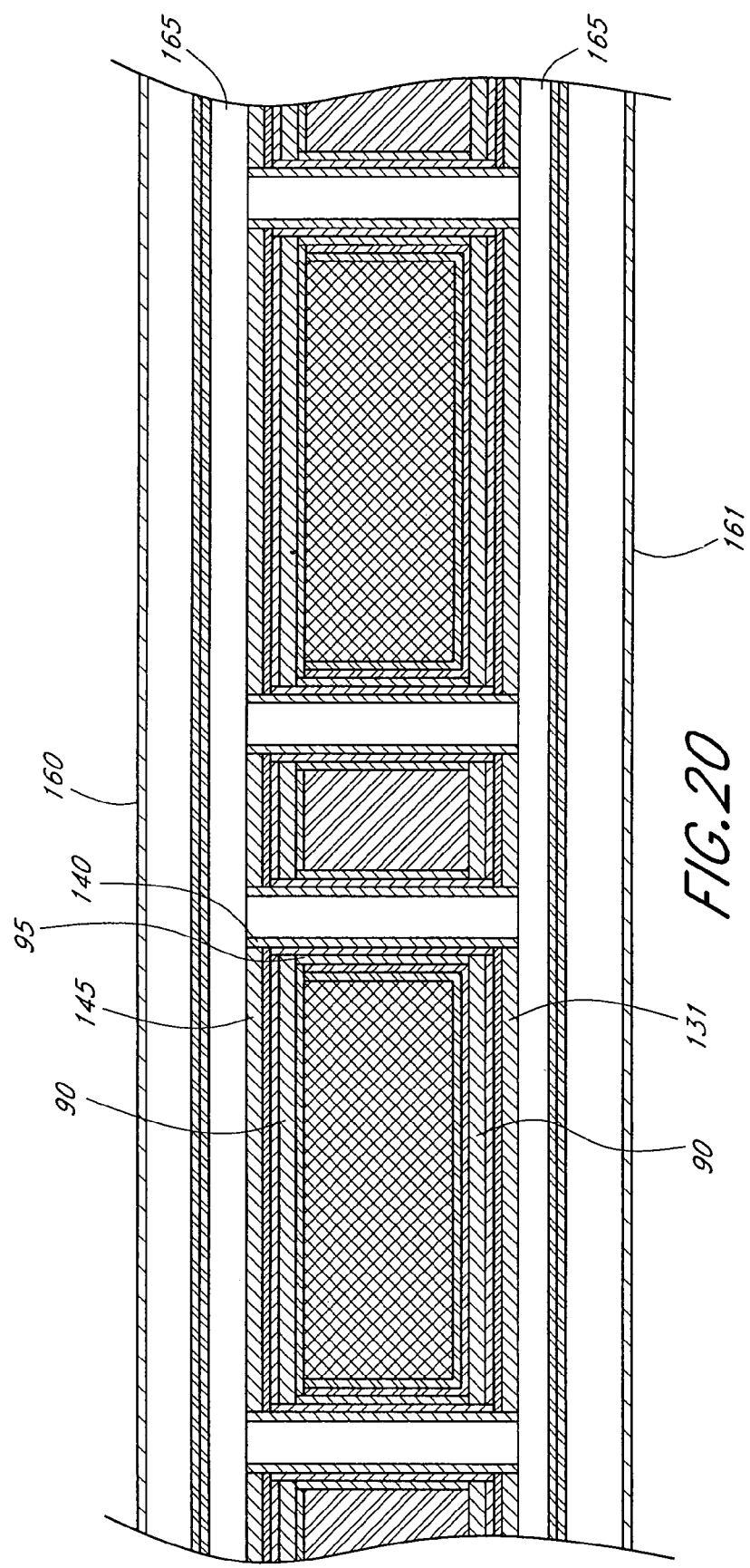
FIG. 20 is a cross-sectional view illustrating the lay-up prepreg and copper foil before lamination.

The surfaces of copper foils 130, 131 are now chemically coated using the SHADOW process. Following the application of a chemical coating using the SHADOW process, the subassembly is again copper plated. The plated copper 145 is shown in FIG. 19 and covers both the copper foil laminate 130, copper foil laminate 131 and the parylene coated walls of the plated through holes 95 so as to form second conductive through holes 140 in the same through hole and thereby electrically connect the third and fourth copper plated foils 130, 131.

Third and fourth printed circuits 150, 151 are then fabricated using the top and bottom layers of plated copper foils 130, 131. These circuits are advantageously formed by vacuum laminating a dry photographically developable film over the top and bottom surfaces of the plated copper. Using standard well known techniques of printed circuitry, these third and fourth layers of circuitry are fabricated by using the dry film to mask the desired circuitry. The exposed (unmasked) copper is then etched from both top and bottom surfaces of the component assembly. The remaining dry film mask is then stripped from those top and bottom surfaces. The remaining copper forms the desired third layer of circuitry 150 on the top surface, the fourth layer of circuitry 151 on the bottom surface, and the circuitry connections between layers 150, 151 provided by the copper plated via holes 140.

The top and bottom surfaces are then chemically cleaned. The component assembly is then vacuum baked to remove any remaining surface chemicals.

Figure 21:
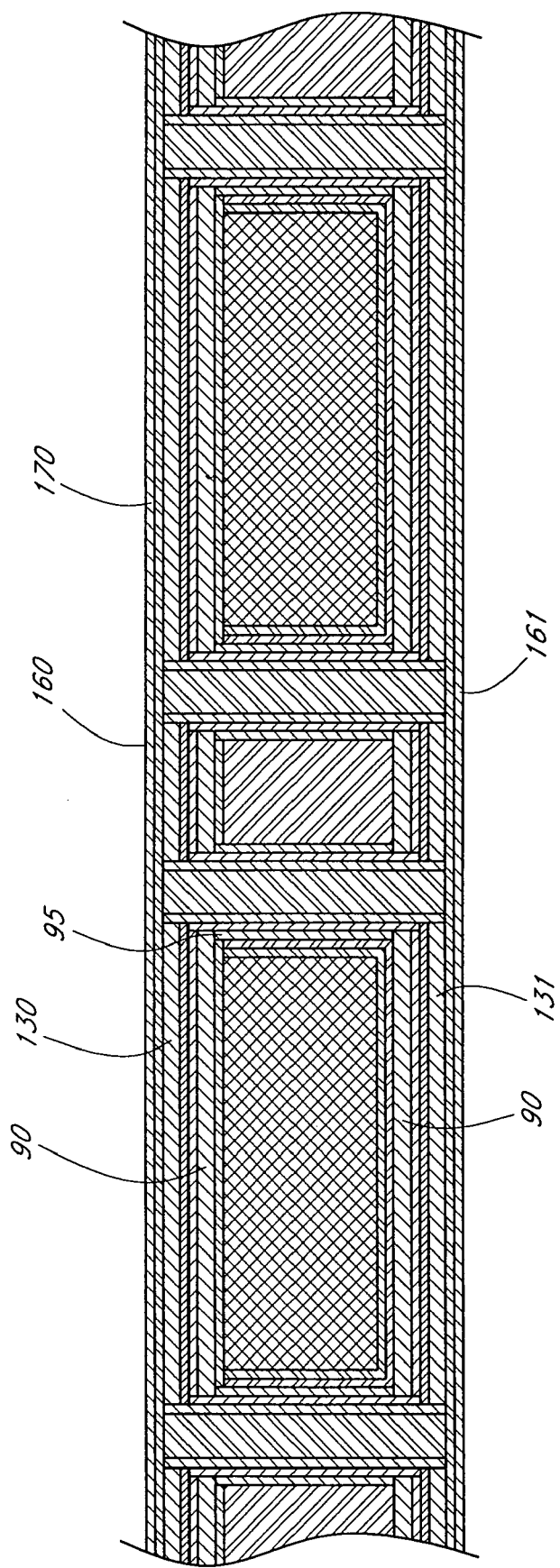
FIG. 21 is a cross-sectional view illustrating the laminated assembly.
Figure 22:
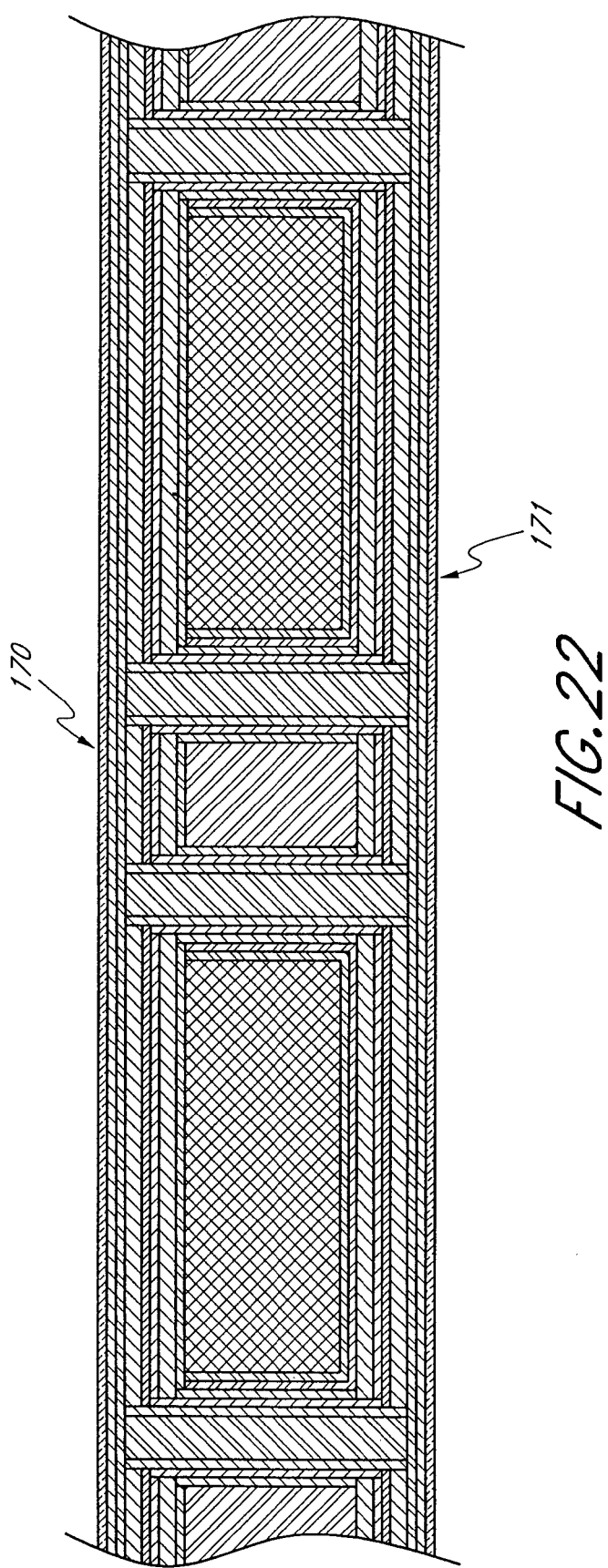
FIG. 22 is a cross-sectional view illustrating the application of a cover layer or solder mask to the assembly.
Figure 35:
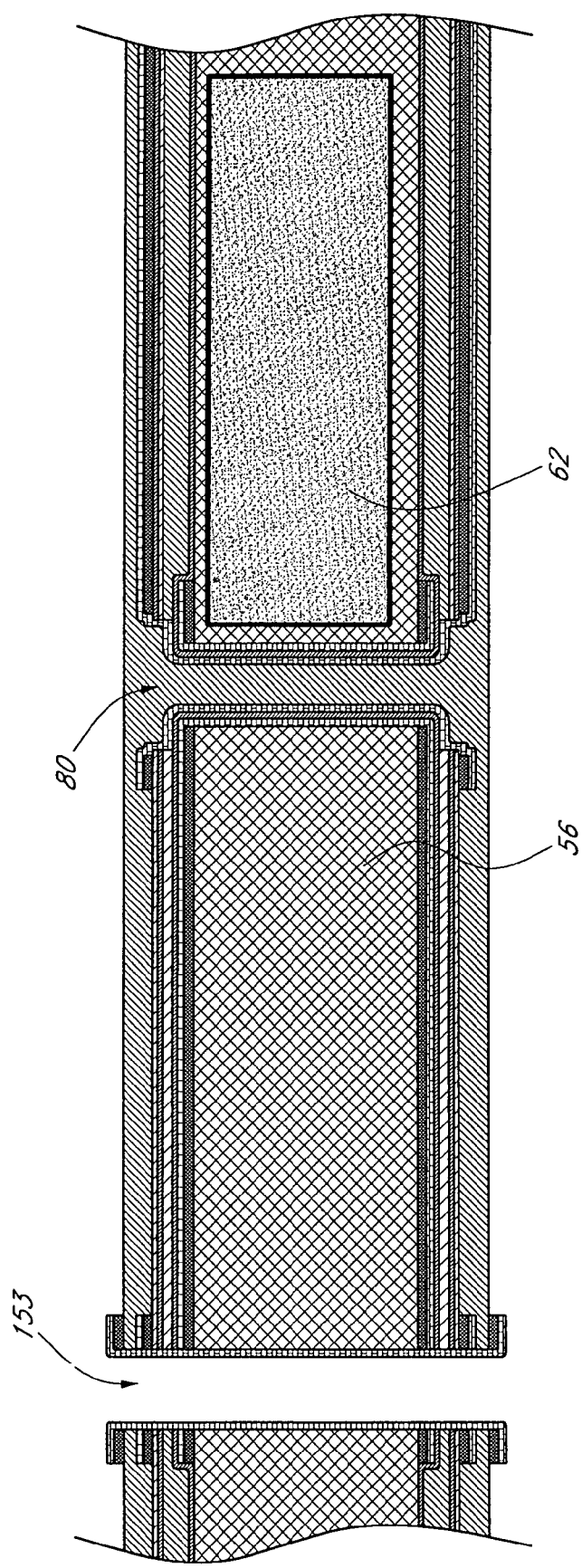
FIG. 35 is a cross-sectional view illustrating the use of the plated through holes for both forming winding turns for conductors and transformers and for providing electrical connections between other printed circuitry layers.

Additional fifth and sixth layers of circuitry 160, 161 are fabricated over the third and fourth layers. In the embodiment shown in FIG. 20, these circuit layers are insulated from the adjacent third and fourth layers by two layers of prepreg 165. By way of example, the Isola medium Tg epoxy prepreg has a voltage breakdown rating of 1100 to 1200volts per mil thickness. By way of specific example, a 4 mil thickness of this prepreg was used to provide a voltage breakdown of over 4000 volts. These fifth and sixth circuit layers are formed following the cleaning and baking steps as follows:

1) Drill the fifth layer 160 and sixth layer 161 copper foils with tooling holes
2) Drill tooling holes in two sheets of adhesive, or prepreg
3) Lay up two additional adhesive coated copper foils 160, 161, or copper foil and prepreg on to the assembly shown in FIG. 19 containing four layers of circuits
4) Laminate all the material together at high temperature and pressure using a vacuum lamination process so the result at this stage of manufacture is an assembly shown in FIG. 21 having six copper foil layers 58, 70, 130, 131, 160 and 161 with circuit layers 58 and 70 interconnected via the plated holes 95 and circuit layers 130 and 131 interconnected by plated holes 140 which are isolated from the plated holes 95 but using the same via holes
5) As shown in FIG. 35, additional through holes 153 may now be selectively drilled through the respective plated copper sheets and support panel 56 to enable, for example, through hole connectors for surface mounted circuit elements, e.g., semiconductors, capacitors, resistors located over the cavity 50 and embedded toroid 62 as shown in FIGS. 34A and 34B.
6) Plasma etch
7) Glass etch
8) Chemical clean the surfaces of layers 160 and 161
9) Shadow Process the surfaces of the interconnecting holes
10) Copper plate the surfaces and the holes
11) Chemical clean
12) Vacuum laminate dry film
13) Expose the fifth and sixth circuit layers 160, 161 for etching
14) Etch the fifth and sixth circuitry layers 160, 161 to form printed circuits from the plated foils 160, 161
15) Strip dry film from surface of the fifth and sixth layers of printed circuitry
16) Chemical Clean
17) Vacuum bake
18) Laminate two covercoats or apply cover layers or solder masks 170, 171 over the fifth and sixth printed circuit layers (as shown in FIG. 22) while including appropriate openings to accommodate components to be assembled there-on
19) Bright tin/lead plate or apply protective coating onto the exposed copper circuitry underneath the covercoat openings
20) Separate each individual assembly by routing or cutting apart the individual rectangular circuits each containing an embedded individual ferrite toroids and six circuitry layers
21) Test
22) Assemble electrical circuit elements onto the individual miniature inductor or transformer components as shown in FIGS. 23 and 34A, 34B
23) Test the final assembly The assembly described above and shown in FIG. 23 has six layers of printed circuitry and two plated through holes 95 and 120 through each hole (via) 80, 81 formed in the support panel 56 around the outside and inside of the embedded toroidal ferrite. In the assembly shown, the first, second, third and fourth printed circuitry layers and plated through holes 95 and 120 form circuitry and the windings of an inductor or transformer.

By way of specific example, FIG. 23 illustrates an embodiment of a miniature power supply 195 constructed in accordance with this invention. As shown, the magnetic components of the power supply are entirely encapsulated within the printed circuit board. By way of specific example, the support panel for this embodiment has a length of 2³⁄₁₆ inches and a width of 1¹³⁄₁₆ inches.

Figure 24:
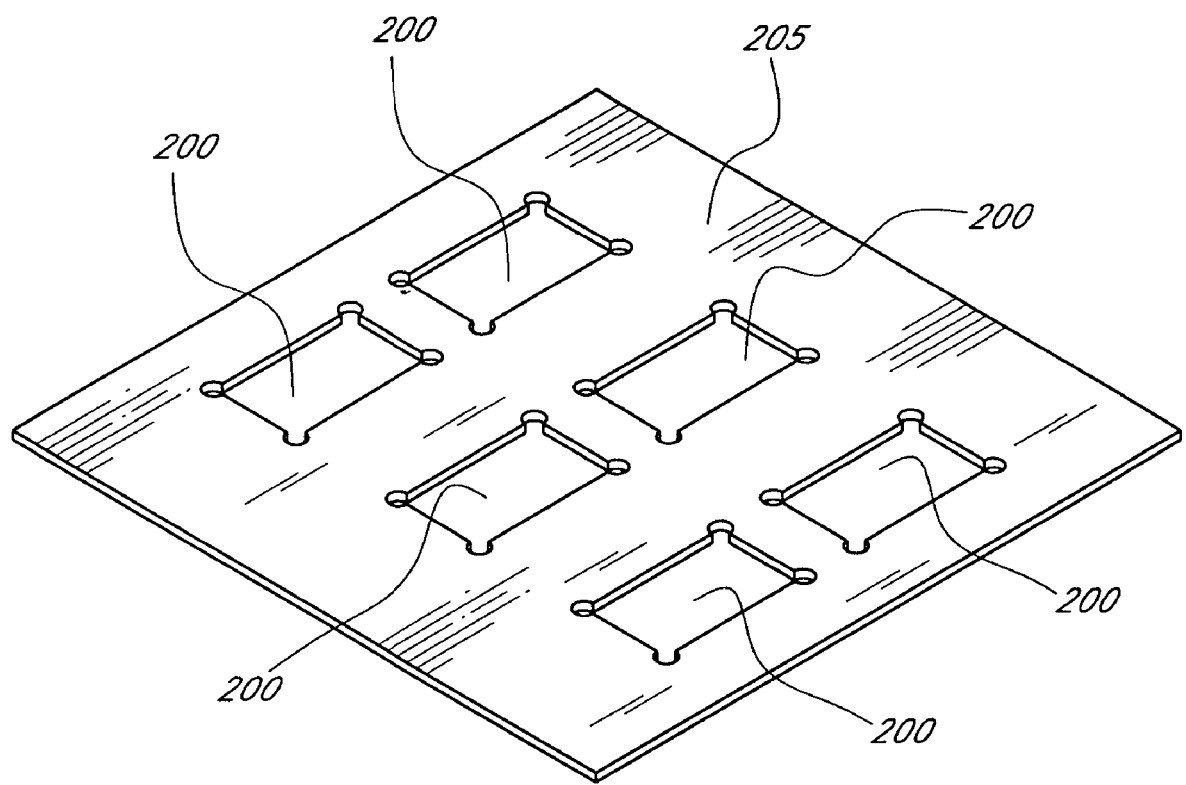
FIG. 24 is a perspective view of another embodiment having a support panel having a plurality of rectangular openings.
Figure 25:
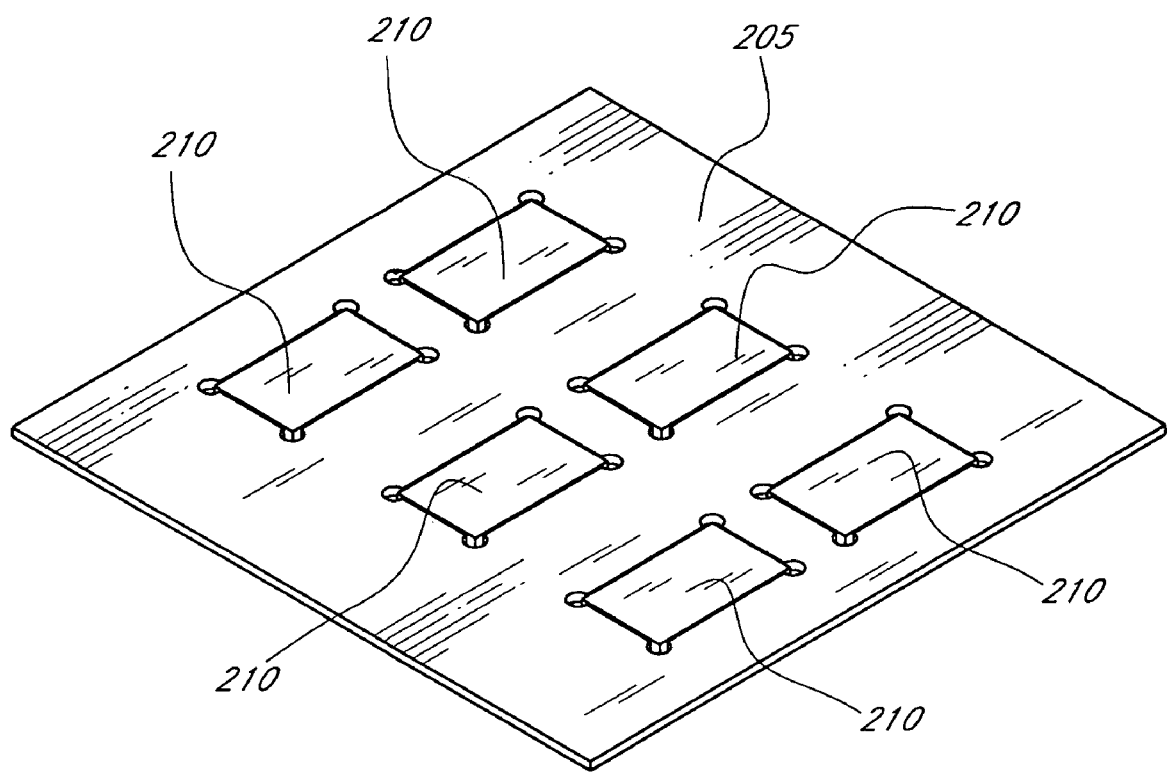
FIG. 25 is a perspective view illustrating a support panel having rectangular ferrite plates in each of the openings.
Figure 26:
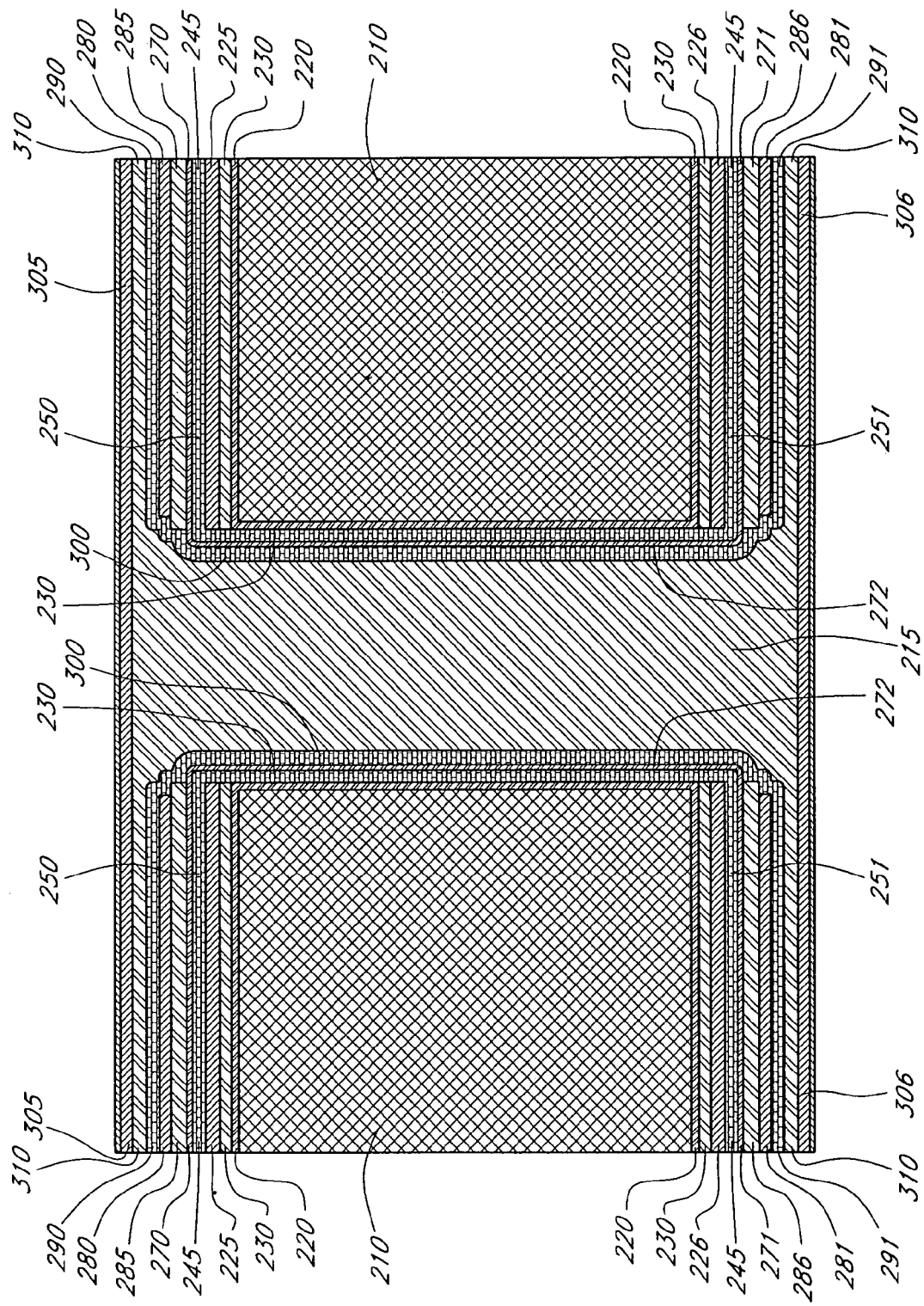
FIG. 26 is a cross-sectional view of an embodiment utilizing rectangular ferrite plates.

In the foregoing embodiment, ferrite toroids are used to form inductors and transformers in the plane of the circuit board or flexible circuit. It will be understood that other types of magnetic or ferrite configurations may be utilized, such as oval shaped toroidal ferrite structures and ferrite slabs having various geometric configurations or other magnetic materials. In other embodiments, the through hole conductors are formed by processes other than copper plating, instead utilizing, for example, conductive pastes. In addition, the plural plated through holes insulated from each other may be formed directly through the magnetic material. Construction of such another embodiment of the invention is shown in FIGS. 24-26. In this embodiment, the manufacture of a multiple through hole assembly utilizes a slab of ferrite material and vias drilled are formed through the ferrite slab. Plural conductive through holes are formed in each via.

As shown in FIG. 24, a plurality of rectangular openings 200 are formed typically by routing, in a support panel 205. Panel 205 is advantageously an FR-4 epoxy laminate sheet although it will be apparent that sheets made from other materials including other types of sheets used for circuit board fabrication are applicable for use as support panel 205. In this embodiment, the openings are formed completely through the support panel.

Ferrite plates 210 are respectively embedded within the openings 200, as shown in FIG. 25. Each of these ferrite plates 210 serve as a ferromagnetic slab on which is fabricated inductive components. As described below, these plates 210 may be formed as shown in FIG. 25 without through holes which are subsequently drilled during construction of the component. In other embodiments a plurality of through holes, as seen in FIG. 27, may be pre-formed during molding of ferrite slabs.

The ferrite plate 210 is shown in cross-section in FIG. 26. This figure shows the surface of the ferrite plate 210 including the walls of its through hole openings 215 covered with an insulating layer 220. Advantageously, this layer is formed by a vacuum deposited parylene coating as described in detail above. Layer 220 insulates the ferrite material from the copper circuitry to be fabricated over the ferrite surface and on the walls of the through holes in the ferrites. This coating is advisable or necessary for low resistivity ferrites, e.g., high permeability ferrites of the order of 2300 PERM. Coating 220 will often not be utilized for lower permeability ferrites, such as 350 PERM ferrites having a higher resistivity.

Copper foils 225, 226 are then respectively laminated to the top and bottom surfaces of the ferrite plate 210 using an epoxy prepreg 230 or other suitable adhesive to affix the foil to the ferrite plate. Depending upon the ultimate application of the inductive component, the copper foil will typically also cover all or part of the support panel 205. In this lamination step and the lamination steps described below, the materials used are selected to provide the desired physical properties for the finished circuitry. These properties are commonly referred to as peel strengths and bond strengths. The preferred materials for laminating are: Crystal, B-1000, R1500 from Rogers Corp., Pyralux FB from Dupont, Calif. 338, CA 333, E33 from Shin-Etsu, AY50KA, CY2535KA, CVK2,530130, SAU, SPC, SPA from Arisawa, and Medium or High Tg epoxy prepregs from Isola.

Through holes or vias 215 in the ferrite plates 210 (shown in FIGS. 26 and 27) enable fabrication of plated through conductors. These plated through vias function as electrical windings for the inductor or transformer device. These holes are typically 12 to 50mil in diameter but can be larger or smaller, (e.g., as small as 4 mil in diameter) depending upon the specifications of the inductor or transformer being manufactured. In some embodiments, the ferrite plates are molded or otherwise pre-formed with the desired through holes 215. In such embodiments, through holes using conventional drilling equipment are drilled through the copper foil after the foil is laminated to the ferrite plate 210. These holes are drilled so as to register with the preformed holes in the ferrite plates. In other embodiments, such as the ferrite plates 210 shown as FIG. 25, the ferrite plates are not pre-formed with holes. In these embodiments, the holes are formed in the ferrite plates 210 after lamination of the copper foils 225, 226. Drilling holes through the ferrite plates and copper foil is advantageously performed using laser drilling equipment.

After drilling, the laminated panels are advantageously plasma etched to clean the drilled holes. This step is advantageously followed by a glass etch to remove spurious glass particles from the holes 215 followed by chemically cleaning the top and bottom surfaces of the exposed copper.

A conventional process is then used to chemically coat (shown at 245) the top and bottom surfaces of the copper foil in preparation of copper plating these top and bottom surfaces as well as the inside surface of all of the through holes 215. This process is commonly referred to as the SHADOW process. An article describing the process entitled "The Reliability of PTH Printed Wiring Boards Manufactured With a Graphite-Based Direct Metallization Process" is included with this application as Appendix A.

Following the application of the chemical coating 245 using the SHADOW process, the subassembly is copper plated. The plated copper is shown in FIG. 26 and covers both the copper foil laminate 225, the copper foil laminate 226 and the internal walls of the through holes (vias) 215 (shown at 230) so as to electrically connect the top and bottom copper foils 225, 226 via the plated through holes 230.

Printed circuits are then fabricated using the top and bottom layers of copper laminate and plated copper. These circuits are advantageously formed by vacuum laminating a dry photographically developable film over the surfaces of the plated copper on the top and bottom of the subassembly.

Using standard techniques of printed circuitry, first and second layers of circuitry are fabricated by using the dry film to mask the desired circuitry. The unmasked copper is then etched from both top and bottom surfaces of the component assembly. The remaining dry film mask is then stripped from those top and bottom surfaces. The remaining copper forms a first layer of circuitry 250 on the top surface, as shown in FIG. 26, and a second layer of circuitry 251 on the bottom surface, interconnected by the copper plate via holes 230.

The top and bottom surfaces are then chemically cleaned. The component assembly is then vacuum baked to remove any remaining surface chemicals or moisture.

The component assembly is then prepared for an additional copper layer and an additional plated via insulated from but fabricated over the first copper layers. An insulating coating is used to separate the multiple layers of circuitry and plated vias. Epoxy, parylene, liquid polymide and other materials may be used. However, as described above, parylene coating has been discovered to be particularly advantageous for forming these insulating layers. In this process, the parylene is vacuum deposited over the entire subassembly to leave, as illustrated in FIG. 26, a thin coating 270 over the top layer of circuitry 250, a thin coating 271 over the bottom layer of circuitry 251 and a thin coating 272 inside the copper plated through hole 230.

In preparation for parylene coating, a very thin Silane and/or Carboxyl layer is deposited on the subassembly using a PECVD process (Plasma Enhanced Chemical Vapor Deposition).

The parylene coating process is further described in the publication entitled "Parylene Conformal Coatings Specifications and Properties," published by Specialty Coating Systems, Indianapolis, Ind. and attached as Appendix B to this application. This parylene coating is pinhole free and has a high dielectric strength with very thin coatings providing very high voltage breakdown values. By way of specific example, parylene coatings formed of Parylene C with thicknesses of 0.0005 mil to 0.001 mil provide a voltage breakdown guard band of about 5600 volts per mil of thickness. Parylene C has a dielectric constant of about 2.28.

Nova HT Parylene described in Appendix C to this application provides an even higher dielectric constant of about 3.15 and provides a voltage breakdown of about 750 volts per micron of thickness. As a result, very thin coatings, e.g., 10 to 15 microns provides a breakdown voltage barrier in the range of 7500 volts or higher.

One embodiment of the parylene coated subassembly is shown in FIG. 27. This and other parylene coatings shown in other photographs were coated at the SCS Coating Center at Ontario, Calif., as described in Appendix D to this application.

Following application of the parylene coating, this subassembly is plasma burned in preparation for additional layers of circuitry over in the top circuit layers and bottom layer 250, 251.

Formation of third and fourth layers of circuitry begins with drilling hole openings in copper foil sheets 280, 281 that will register over the circuitry openings shown in FIG. 26. Similar openings registering with these through hole openings are drilled in two sheets of adhesive 285, 286. A low temperature lamination process is then used to partially laminate the pre-drilled copper foils 80, 81 to the pre-drilled adhesives so that the respective openings are aligned as shown in FIG. 26. The adhesive coated copper foil 280 is then attached to the surface of the parylene coated top surface of this first circuitry layer 250 and the adhesive coated copper foil 281 is attached to the surface of the parylene coated second circuitry layer 261.

Copper foils 280, 281 are then laminated to the subassembly at high temperature and pressure to form a four copper layer assembly with the third layer 280 and the fourth layer 281, respectively, insulated from the circuitry layers 2 by the respective parylene coating layers 270, 271.

The surfaces of copper foils 280, 281 are now chemically coated using the SHADOW process. Following the application of a chemical coating using the SHADOW process, the subassembly is again copper plated. The plated copper is shown in FIG. 26 and covers both the copper foil laminate 280 (as shown at 290), copper foil laminate 281 (as shown at 291) and the parylene coated walls of the plated through holes (vies) 230 (shown at 300) so as to electrically connect the third and fourth copper plated foils 280, 281 via plated through holes 300.

Third and fourth printed circuits are then fabricated using the top and bottom layers of plated copper foils 280, 281. These circuits are advantageously formed by vacuum laminating a dry photographically developable film over the top and bottom surfaces 280, 281 of the plated copper.

Using the well known conventional techniques of printed circuitry, these third and fourth layers of circuitry are fabricated by using the dry film to mask the desired circuitry. The exposed, i.e., unmasked copper is then etched from both top and bottom surfaces of the component assembly. The remaining dry film mask is then stripped from those top and bottom surfaces. The remaining copper forms the desired third layer of circuitry on the top surface, the fourth layer of circuitry on the bottom surface, and the circuitry connections between the third and fourth layers connected to the copper plated via holes 300.

The top and bottom surfaces are then chemically cleaned. The component assembly is then vacuum baked to remove any remaining surface chemicals.

Additional through hole connection holes may now be selectively drilled through the respective copper sheets and panel 205 to enable, for example, through hole connections for the circuit elements located over the ferrite plate 210.

Additional fifth and sixth layers of circuitry 305, 306 are fabricated over the third and fourth layers. In the embodiment shown in FIG. 7, these circuit layers are insulated from the adjacent third and fourth layers by a relatively thick single or two or more layers of prepreg 310. By way of example, the Isola medium Tg epoxy prepreg has a voltage breakdown rating of 1100 to 1200 volts per mil thickness. By way of specific example, a 4mil thickness of this prepreg was used to provide a voltage breakdown of over 4000 volts. These fifth and sixth layers are formed following the cleaning and baking steps as follows:

1) Drill the fifth and sixth layer copper foils with tooling holes
2) Drill tooling holes in two sheets of adhesive, or prepreg
3) Kiss laminate predrilled two copper foils with predrilled adhesive
4) Lay up adhesive coated copper foil and prepreg with panels containing layers 1, 2, 3, and 4
5) Laminate all the material together at high temperature and pressure using ordinary (vacuum) lamination process so the result is a six copper layer assembly with layers 1 and 2 interconnected via the plated holes and layers 3 and 4 interconnected but isolated from layers 1 and 2 using the same holes
6) Drill additional connection holes on the six layer assembly
7) Plasma etch
8) Glass etch
9) Chemical clean the surfaces of layers 5 and 6
10) Shadow Process the surfaces of layers 5 and 6 and the interconnecting holes
11) Copper plate the surfaces and the holes
12) Chemical clean
13) Vacuum laminate dry film
14) Expose layers 5 and 6 circuitry for etching
15) Etch layers 5 and 6 circuitry
16) Strip dry film from surface of layers 5 and 6
17) Chemical Clean
18) Vacuum bake
19) Laminate two covercoats or (apply cover layers-new) over layers 5 and 6 with appropriate openings to accommodate components to be assembled there-on
20) Bright tin/lead plate or (apply protective coating-new) onto the exposed copper circuitry underneath the covercoat openings
21) Separate each individual assembly by routing the individual rectangular circuits each containing individual ferrite towards with 6 circuit layers
22) Test
23) Assemble components onto the individual rectangular circuits
24) Test the final assembly The assembly described above and shown in FIG. 26 has six layers of circuitry and two plated through holes 230 and 300 through each hole (via) 215 formed in the ferrite plate 210. In the assembly shown, the first, second, third and fourth circuit layers 225, 226, 280 and 281 and plated through holes advantageously form the windings of a "virtual toroid" inductor or transformer constructed in accordance with pending U.S. patent application entitled Electronic Transformer Inductor Devices and Methods for Making Same, Ser. No. 10/659,797, Publication No. 2004/0135662-A1, a copy of which is attached as Appendix E.

The plated through holes and printed circuitry may also be used to construct other embodiments of inductors and transformers. Examples are Cell Core transformers also described in the pending application, Appendix E.

The processes described above can be used to produce multiple independent through holes in ferrite and other materials such as printed circuit board and flex. Thus, additional layers of copper foil and copper plate advantageously insulated by a parylene coating allows additional independent plated conductors in a single via.

In other embodiments, a third or fourth plated conductive through hole each insulated by a layer of parylene, are constructed in the manner described above to provide, for example, additional turns around the ferrite core or additional through hole connectors for circuitry on the support panel.

Figure 29:
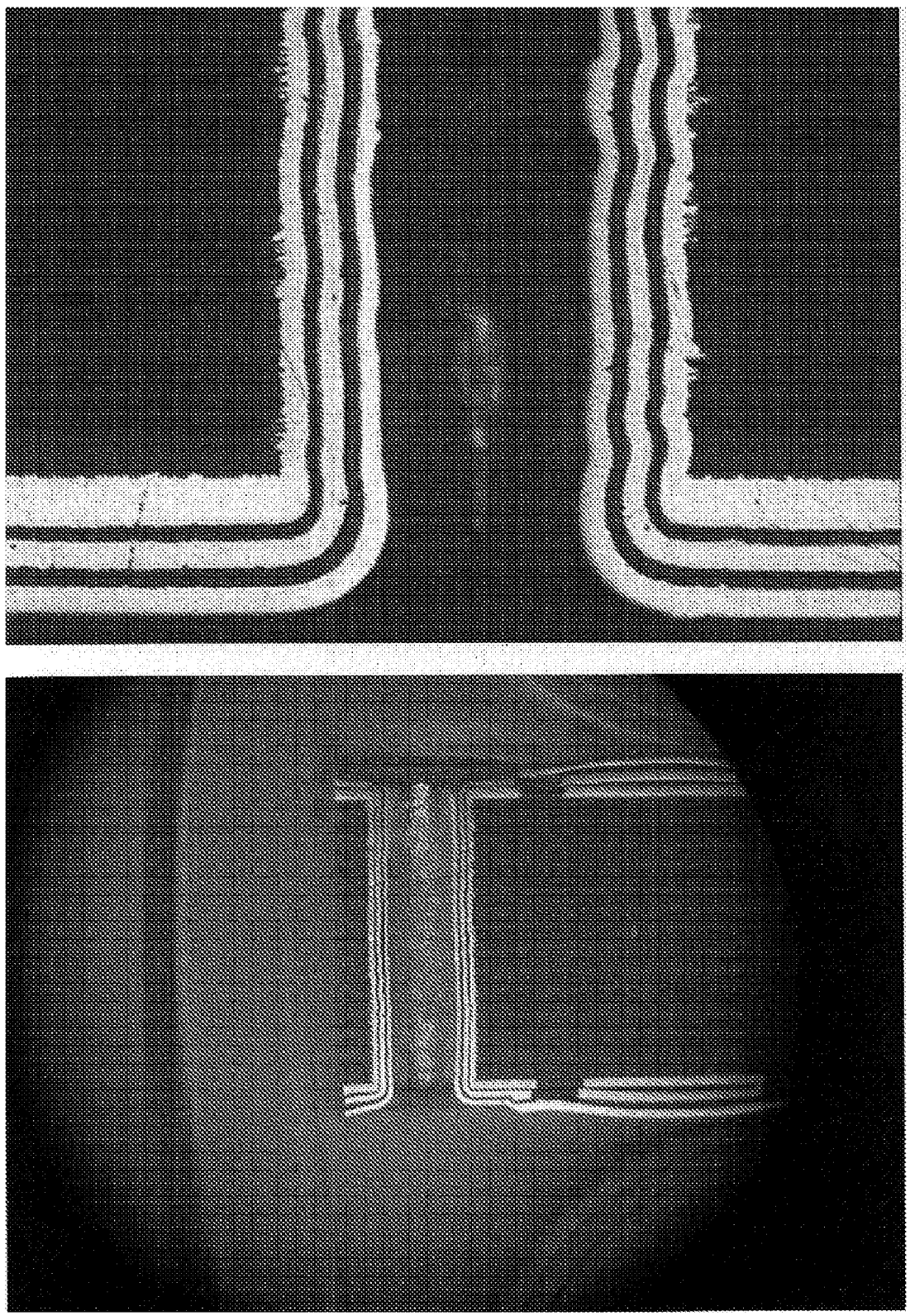
FIG. 29 is a photomicrographic view of an exemplary cross-section showing three parylene insulated conductive vias in a single via hole as formed by this invention.
Figure 30:
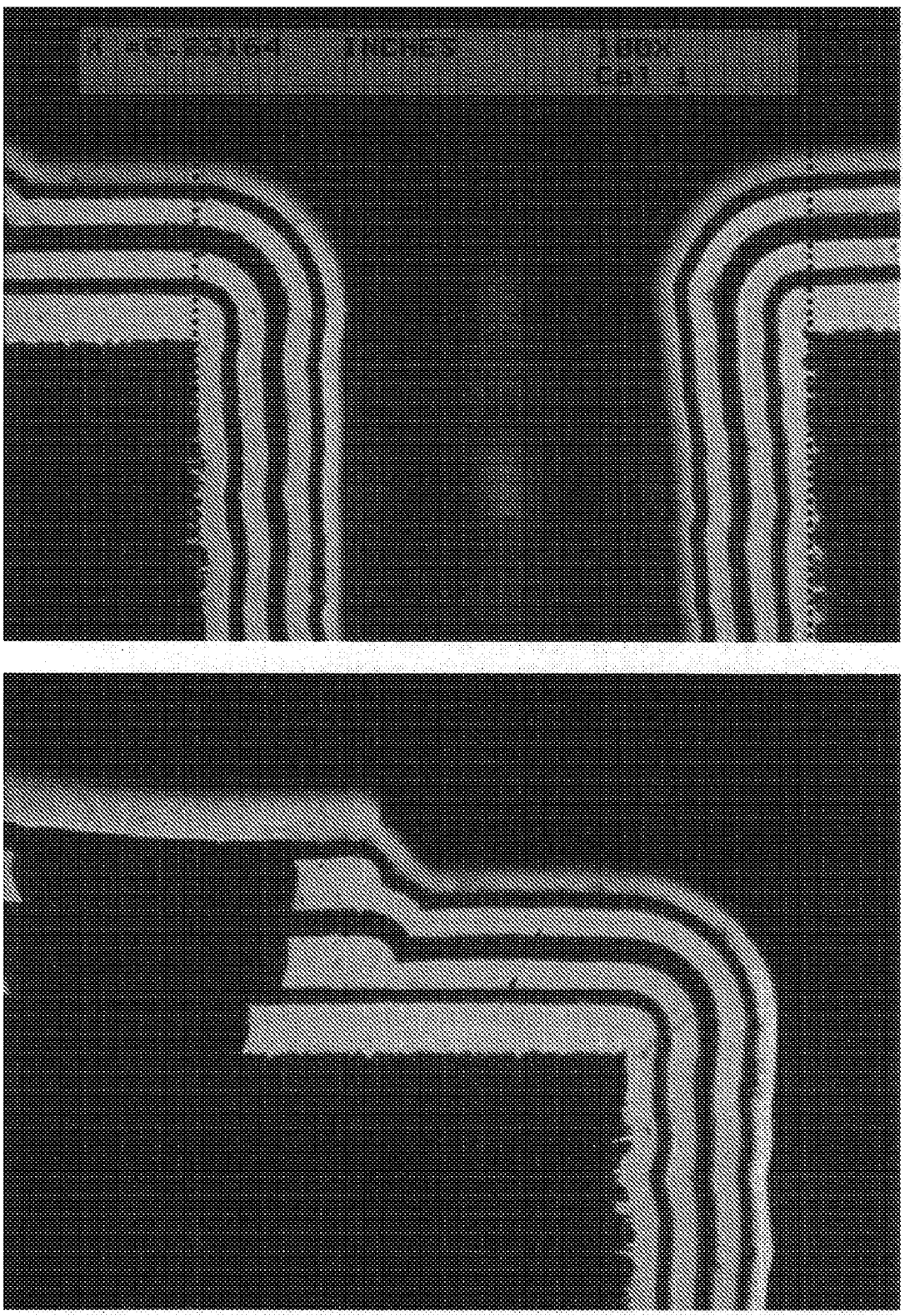
FIG. 30 is a photomicrographic view of an exemplary cross-section showing four insulated conductor vias in a single via hole as formed by this invention.
Figure 31A:
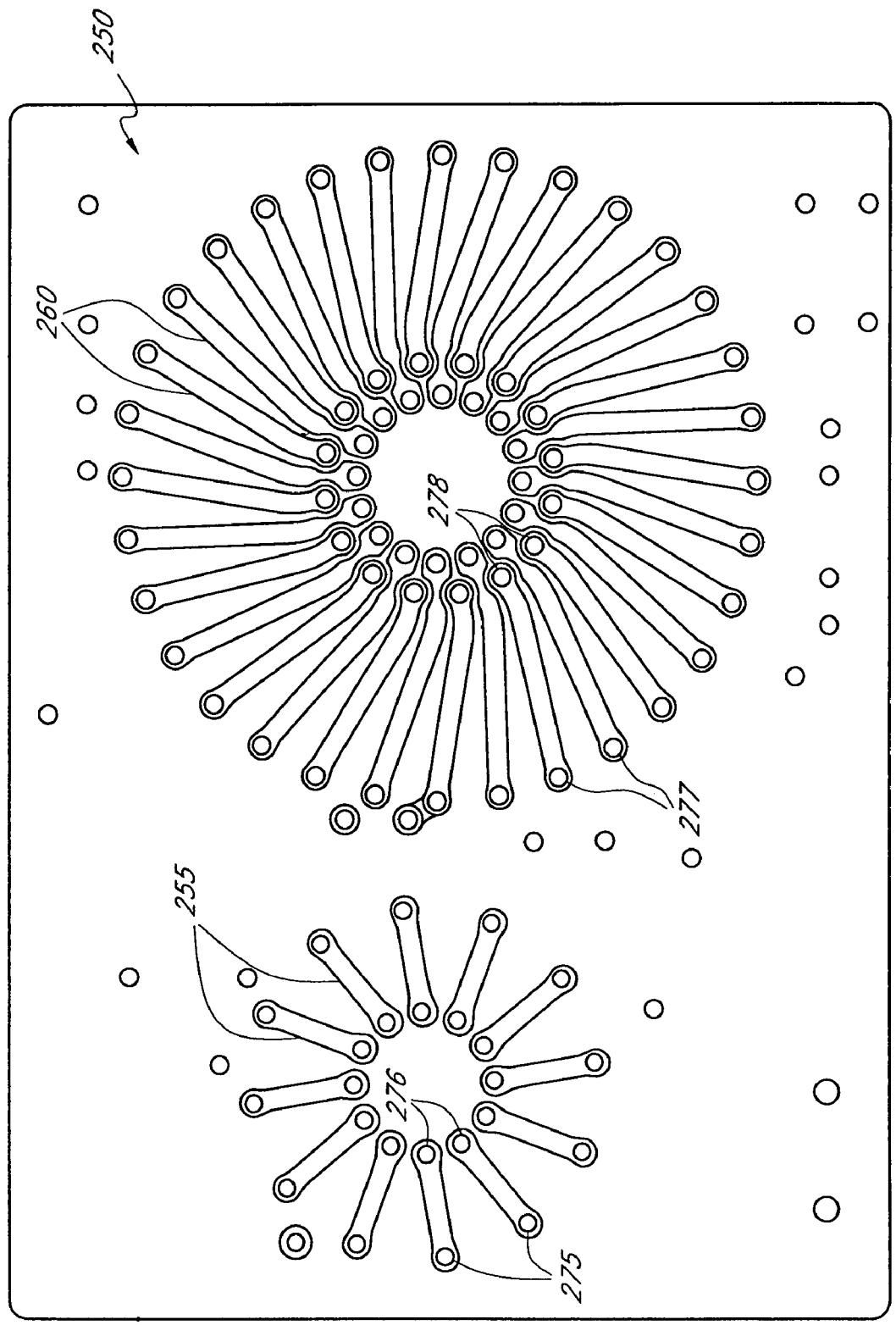
FIG. 31A is an elevational view of the first or top printed circuit level of another embodiment having two toroids embedded into the support panel.
Figure 31B:
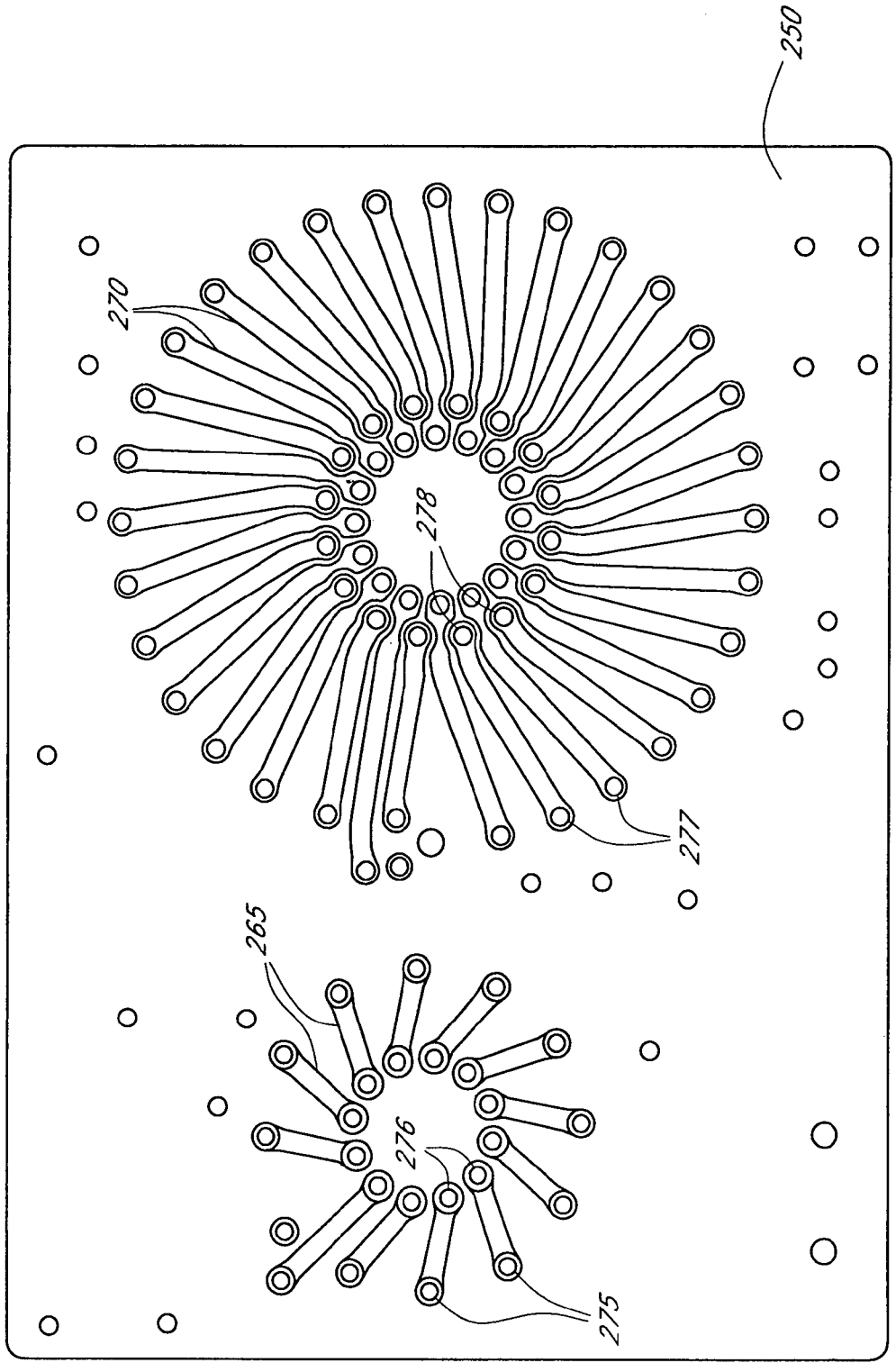
FIG. 31B is an elevational view of the second or bottom printed circuit level of the embodiment of FIG. 31A.

FIGS. 29, 30, and 31 are photomicrographic views of cross-sections of printed circuit board in which plural plated through hole circuits are formed in vias of the board. FIG. 29 illustrates two conductors constructed in a single via as described above. FIG. 30 illustrates three plated through hole conductors in a single via and FIG. 31 illustrates four plated through hole conductors in a single via.

Another embodiment is shown in FIGS. 31A, 31B, 32A, 32B, 33A, 33B, 34A, 34B, and 35. In this embodiment, each electrical component incorporates two inductors of different sizes embedded into the support panel. The component shown is an extremely small power supply constructed on a panel 250 which is only 2.000 inch long by 1.500 inch wide. In this panel are formed two toroidal cavities. Toroidal ferrites having different outside diameters are situated in these cavities. Using the process described above and illustrated in FIGS. 1-22, a first printed circuit is etched in the top layer of the panel and a second printed circuit is etched in the bottom layer of its panel. The first printed circuit layer includes respective primary windings 255 and 260 shown in FIG. 31A. The second printed circuit layer includes primary windings 265 and 270 shown in FIG. 31B. Also shown are the plated through holes 275, 276, 277, and 278, drilled outside and inside the respective toroidal ferrites, and plated in the manner described above. Printed circuits 255, 265 and plated through holes 275, 276 form the windings of an inductor. Printed circuits 260, 270 and plated through holes 277, 278 form the primary windings of a transformer.

Figure 32A:
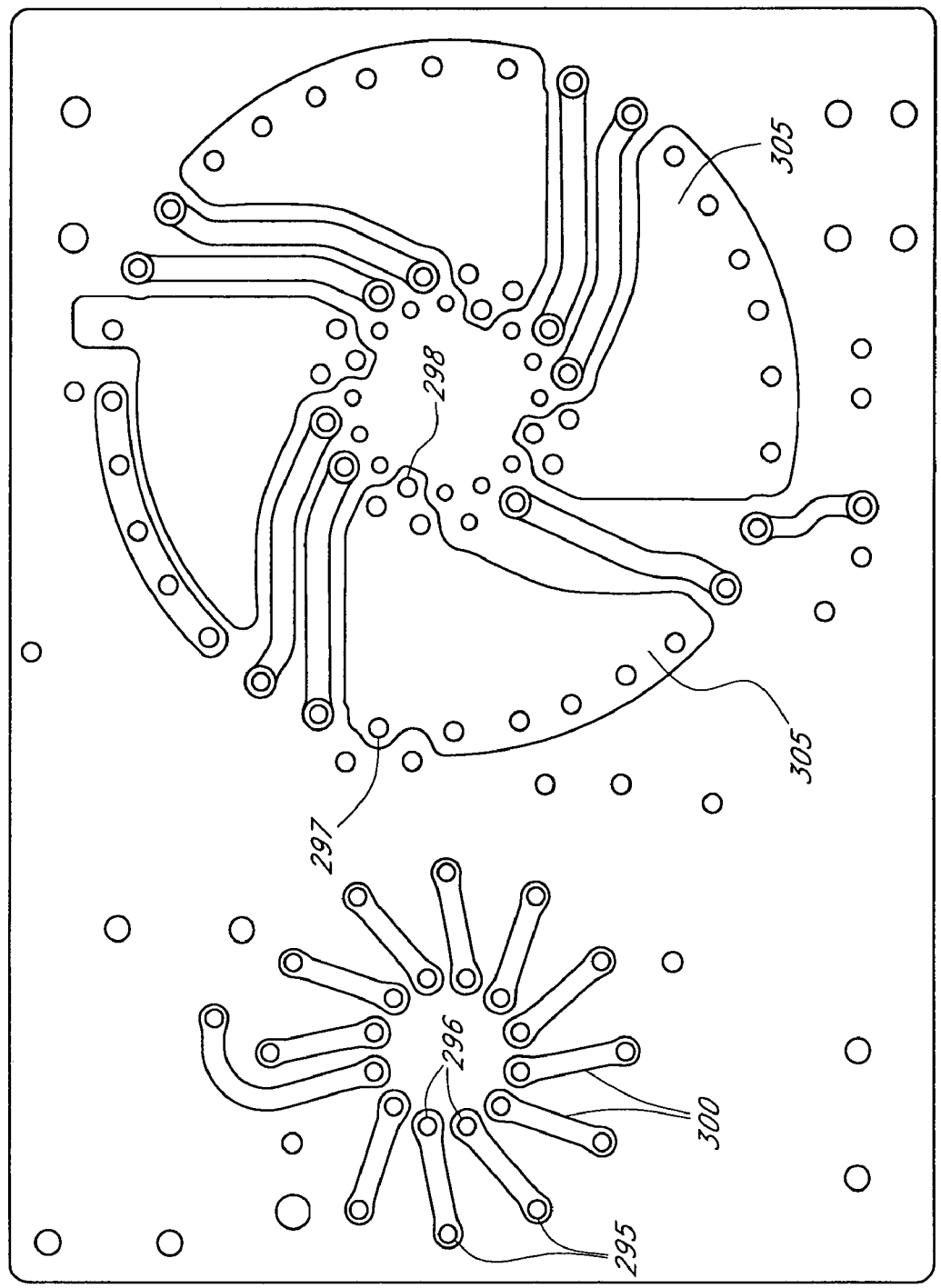
FIG. 32A is an elevational view of the third printed circuit level, of the embodiment of FIG. 31A, formed in a plane proximate to and over the plane of the first printed circuit layer.
Figure 32B:
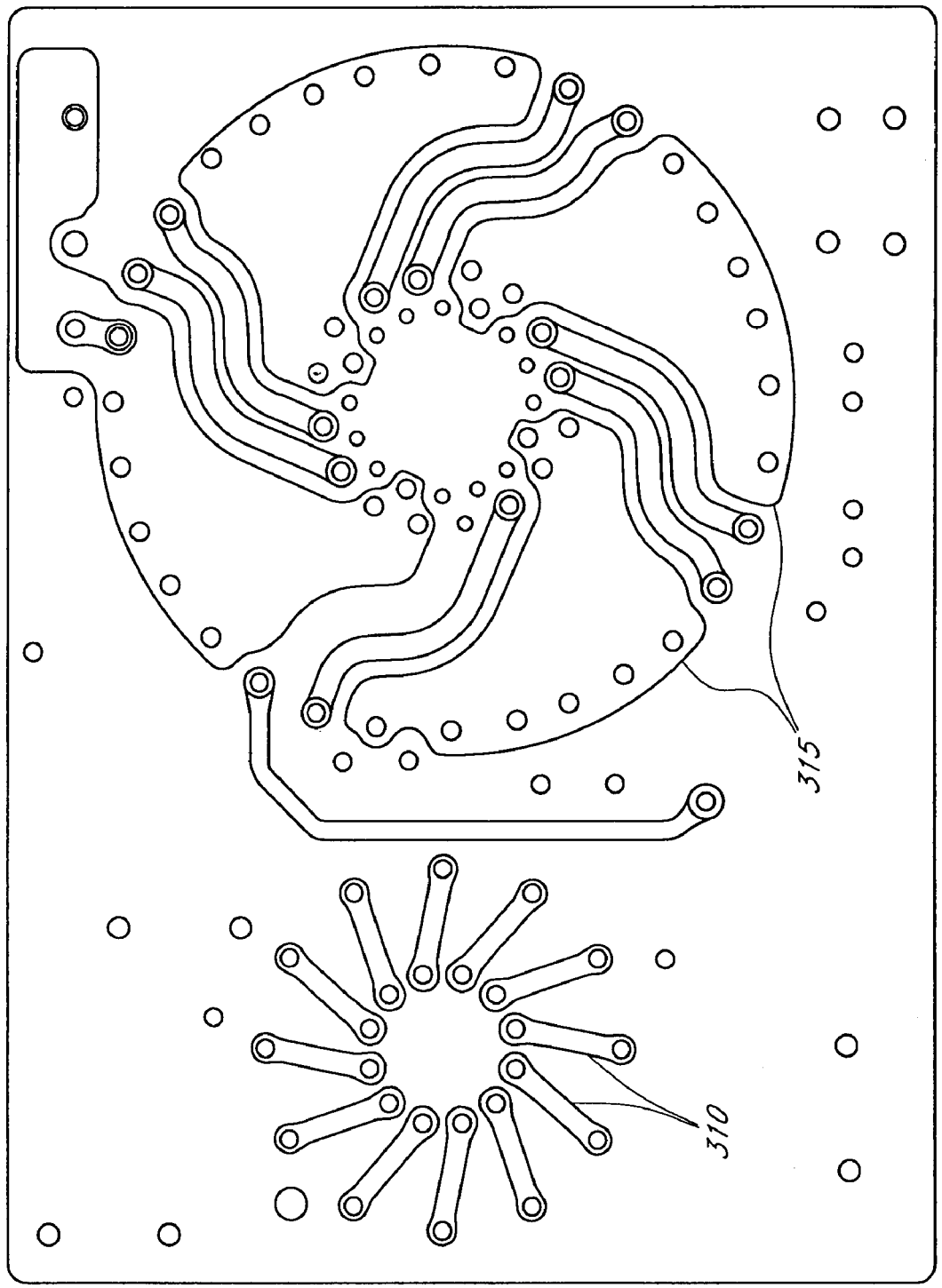
FIG. 32B is the elevational view of fourth printed circuit level formed in a plane proximate to and over the plane of the second printed circuit level of FIG. 31B.

Following a parylene coating as described above, a third printed circuit is formed in its top surface and a fourth printed circuit is formed on its bottom surface of the sub-assembly as shown in FIGS. 32A and 32B. In addition second plated through holes 295, 296, 297 and 298 are respectively formed in this same through holes as plated through holes 275, 276, 277 and 278 but insulated therefrom by the parylene coating. The third printed circuit layer includes additional windings 300 and 305. The fourth printed circuit layer includes additional windings 310, 315.

Printed circuits 300, 310 and plated through holes 295, 296 from another set of windings for the inductor. Printed circuits 305, 315 and plated through holes 297, 298 form the secondary winding of the transformer. In this example show, the transformer is a step-down transformer having 32 primary windings and 4 secondary windings to provide an 8to 1 turns ratio transformer.

Figure 33A:
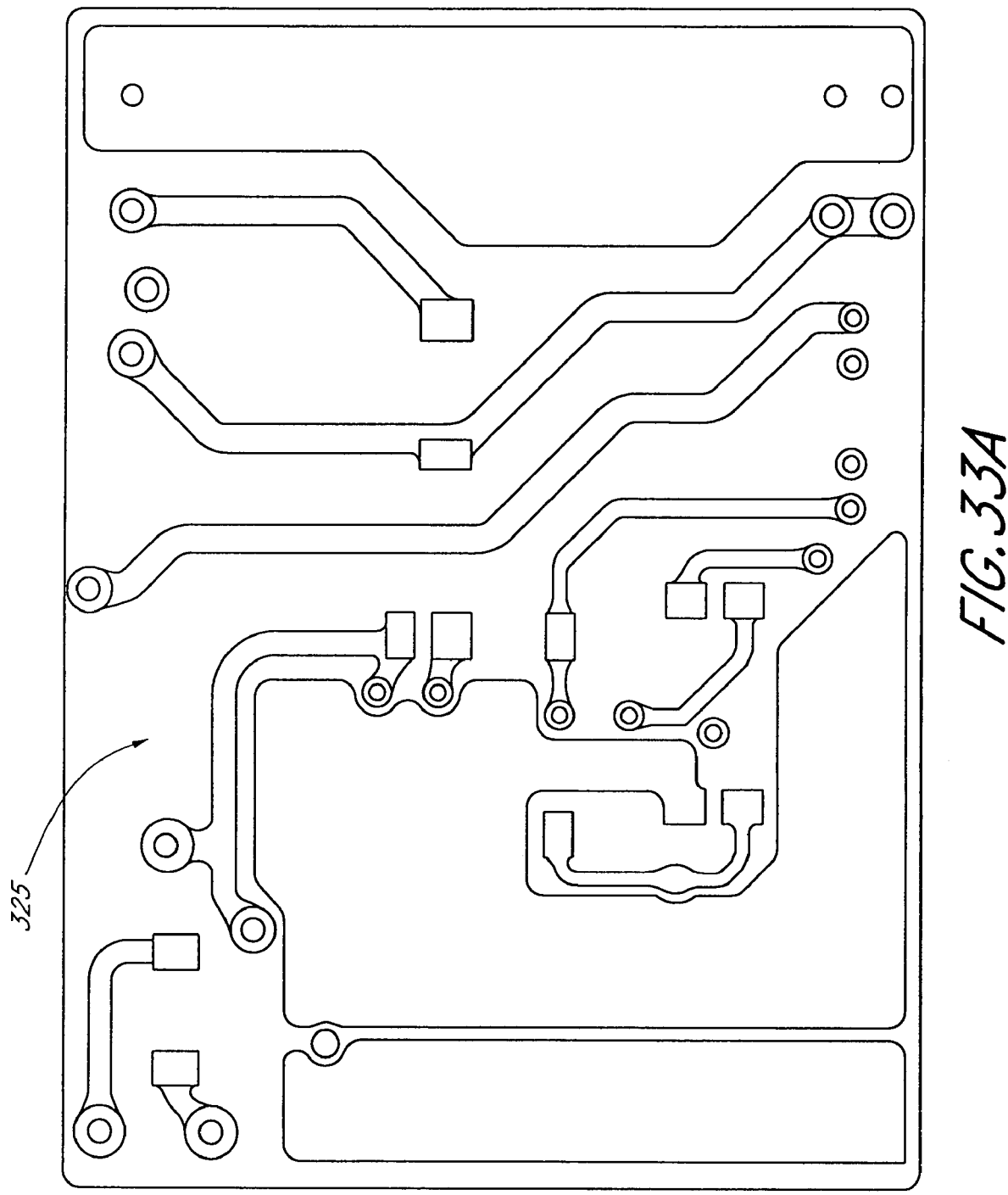
FIG. 33A is an elevational view of the fifth printed circuit level of the embodiment of FIG. 31A, formed in a plane proximate to and over the plane of the third printed circuit level of FIG. 32A.
Figure 33B:
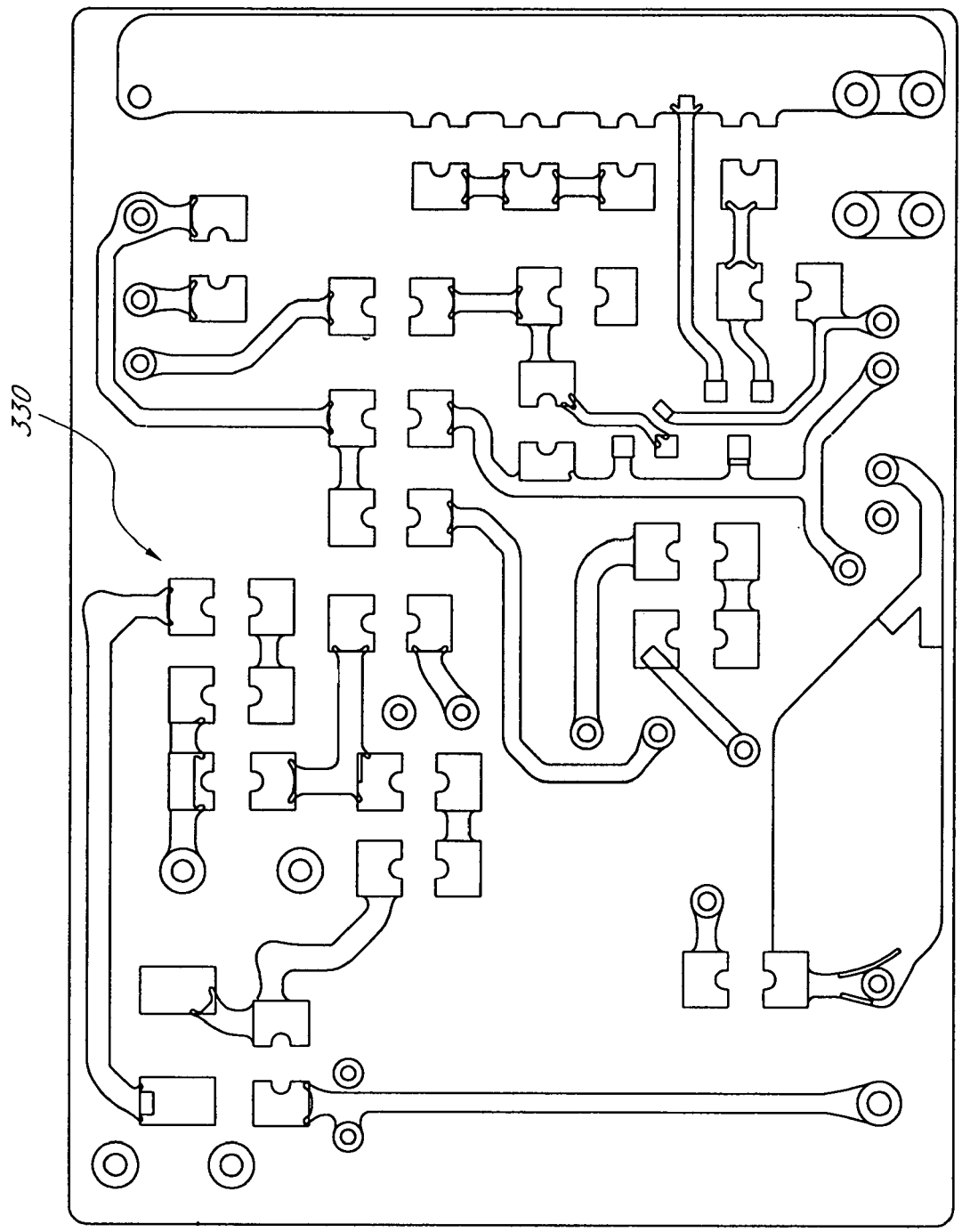
FIG. 33B is an elevational view of the sixth printed circuit level of the embodiment of FIG. 31A proximate to and over the plane of the fourth printed circuit level of FIG. 32B.

A fifth printed circuit 325 is formed over the top surface of the top subassembly the third printed circuit layer as shown in FIG. 33A. A sixth printed circuit 330 is formed in the bottom surface of the subassembly as shown in FIG. 33B. The circuitry elements for completing the power supply are attached as the respective surface of the subassembly. An aspect of the construction shown that contributes to the miniaturization of the electronic component is that the fifth and sixth printed circuitry 325, 330 and attached circuit elements can utilize the entire surface of the support panel including the surface space over the embedded ferrite toroids. As such, the resulting power supplies and other components utilizing inductors and transformers can be constructed considerably smaller than conventional surface mounted transformers and inductors.

The above presents a description of the best mode contemplated for the components and methods of manufacturing said in such full, clear, concise and exact terms as to enable any person skilled in the art to which it pertains to produce these components and practice these methods. These components and methods are, however, susceptible to modifications that are fully equivalent to the embodiment discussed above. Consequently, these components and methods are not limited to the particular embodiment disclosed. On the contrary, these apparatuses and methods cover all modifications coming within the spirit and scope of the present invention.

What is claimed is:

1. A multiple layered printed circuit comprising
   first and second printed circuits on opposite sides of an insulating support member,
   insulation layers respectively covering said first and second printed circuits,
   third and fourth printed circuits over said insulated first and second layers,
   at least one opening through said support member,
   at least two plated through conductors in at least one opening, said conductors insulated from each other by a thin vacuum deposited film, and
   one of said plated through conductors electrically connected to printed circuits on opposite sides of said support member and another of said plated through hole.

2. The circuit of claim 1, wherein said support member is formed from a printed circuit board.

3. The circuit of claim 1, wherein said support member is formed of flex circuit.

4. The circuit of claim 1, wherein said thin vacuum deposited film is parylene.

5. A circuit composing
   a plurality of plated through holes in a support member, and
   a thin vacuum deposited insulating member between each of said plated through holes.

6. The circuit of claim 5, wherein said support member is formed from a printed circuit board.

7. The circuit of claim 5, wherein said support member is formed from flex circuit.

8. The circuit of claim 5, wherein said thin vacuum deposited film is parylene.

* * * * *

UNITED STATES PATENT AND TRADEMARK OFFICE
CERTIFICATE OF CORRECTION

PATENT NO. : 7,602,272 B2
APPLICATION NO. : 11/895447
DATED : October 13, 2009
INVENTOR(S) : Ronald W. Whittaker et al.

It is certified that error appears in the above-identified patent and that said Letters Patent is hereby corrected as shown below:

At column 5, line 52, change "750volts" to -- 750 volts --, therefor.

At column 6, line 3, change "15,000volts" to -- 15,000 volts --, therefor.

At column 7, line 36, change "1200volts" to -- 1200 volts --, therefor.

At column 9, line 41, change "50mil" to -- 50 mil --, therefor.

At column 11, line 64, change "4mil" to -- 4 mil --, therefor.

At column 13, line 44, change "8to" to -- 8 to --, therefor.

Signed and Sealed this

Twentieth Day of April, 2010

David J. Kappos
*Director of the United States Patent and Trademark Office*